United States Patent
Bristol et al.

(10) Patent No.: US 9,570,349 B2
(45) Date of Patent: Feb. 14, 2017

(54) NON-LITHOGRAPHICALLY PATTERNED DIRECTED SELF ASSEMBLY ALIGNMENT PROMOTION LAYERS

(71) Applicant: Intel Corporation, Santa Clara, CA (US)

(72) Inventors: Robert L. Bristol, Portland, OR (US); Rami Hourani, Portland, OR (US); Eungnak Han, Portland, OR (US); James M. Blackwell, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/237,542

(22) Filed: Aug. 15, 2016

(65) Prior Publication Data

US 2016/0351449 A1 Dec. 1, 2016

Related U.S. Application Data

(63) Continuation of application No. 14/778,562, filed as application No. PCT/US2013/048307 on Jun. 27, 2013, now Pat. No. 9,418,888.

(51) Int. Cl.
*H01L 21/31* (2006.01)
*H01L 21/469* (2006.01)
(Continued)

(52) U.S. Cl.
CPC ... *H01L 21/76897* (2013.01); *H01L 21/02118* (2013.01); *H01L 21/31051* (2013.01);
(Continued)

(58) Field of Classification Search
CPC .......................... H01L 23/528; H01L 29/0649
(Continued)

(56) References Cited

U.S. PATENT DOCUMENTS 8,771,929 B2 * 7/2014 Guillorn ............ B81C 1/00031
430/323
2009/0326269 A1 12/2009 Jacobson et al.
(Continued)

FOREIGN PATENT DOCUMENTS

KR 10-2008-0085514 9/2008
KR 10-2010-0120940 11/2010
KR 10-1101431 12/2011

OTHER PUBLICATIONS

Office Action including Search Report from the Examiner of the Intellectual Property Office (IPO) for Taiwan Patent Application No. 103121022 dated Aug. 5, 2015 and English translation thereof.
(Continued)

*Primary Examiner* — S. V. Clark
(74) *Attorney, Agent, or Firm* — Blakely, Sokoloff, Taylor & Zafman LLP

(57) ABSTRACT

A method of an aspect includes forming a directed self assembly alignment promotion layer over a surface of a substrate having a first patterned region and a second patterned region. A first directed self assembly alignment promotion material is formed selectively over the first patterned region without using lithographic patterning. The method also includes forming an assembled layer over the directed self assembly alignment promotion layer by directed self assembly. A plurality of assembled structures are formed that each include predominantly a first type of polymer over the first directed self assembly alignment promotion material. The assembled structures are each adjacently surrounded by predominantly a second different type of polymer over the second patterned region. The first directed self assembly alignment promotion material has a greater chemical affinity for the first type of polymer than for the second different type of polymer.

13 Claims, 13 Drawing Sheets

(51) Int. Cl.
  *H01L 21/768* (2006.01)
  *H01L 21/02* (2006.01)
  *H01L 23/532* (2006.01)
  *H01L 21/3105* (2006.01)
  *H01L 21/311* (2006.01)

(52) U.S. Cl.
  CPC .. *H01L 21/31127* (2013.01); *H01L 21/76822* (2013.01); *H01L 21/76834* (2013.01); *H01L 23/5328* (2013.01); *H01L 23/5329* (2013.01)

(58) Field of Classification Search
  USPC .................. 438/761, 780; 257/635, 642, 643
  See application file for complete search history.

(56) References Cited

U.S. PATENT DOCUMENTS

| | | |
|---|---|---|
| 2010/0210098 A1 | 8/2010 | Faltermeier et al. |
| 2013/0034811 A1 | 2/2013 | Peeters et al. |
| 2014/0099583 A1* | 4/2014 | Holmes ................. G03F 7/0002 430/326 |
| 2014/0370718 A1* | 12/2014 | Chakrapani ....... H01L 21/67103 438/725 |
| 2015/0261090 A1* | 9/2015 | Willson ................... G03F 7/20 430/325 |

OTHER PUBLICATIONS

Notification of Transmittal of the International Search Report and The Written Opinion of the International Searching Authority, or the Declaration for PCT/US2013/048307 mailed Mar. 27, 2014, 9 pages.

Decision of Rejection from the Taiwan Intellectual Property Office (IPO) for Taiwan Patent Application No. 103121022 dated Mar. 10, 2016 and English translation thereof.

Notification of Transmittal of the International Search Report and The Written Opinion of the International Searching Authority, or the Declaration for PCT/US2013/048307 mailed Jan. 7, 2016, 6 pages.

\* cited by examiner

METHOD OF FORMING DIRECTED SELF
ASSEMBLY ALIGNMENT PROMOTION
LAYER THROUGH ONE OR MORE
PREFERNTIAL REACTIONS 425

FORM FIRST DIRECTED SELF ASSEMBLY ALIGNMENT
PROMOTION MATERIAL SELECTIVELY OVER FIRST
PATTERNED REGION, BUT NOT SUBSTANTIALLY OVER
SECOND PATTERNED REGION, BY PERFORMING
REACTION THAT IS SELECTIVE OR AT LEAST
PREFERENTIAL TO MATERIAL OF FIRST PATTERNED
REGION AS COMPARED TO SECOND DIFFERENT
MATERIAL OF SECOND PATTERNED REGION ⎯426

FORM SECOND DIFFERENT DIRECTED SELF ASSEMBLY
ALIGNMENT PROMOTION MATERIAL SELECTIVELY OVER
SECOND PATTERNED REGION, BUT NOT
SUBSTANTIALLY OVER FIRST PATTERNED REGION, BY
PERFORMING REACTION THAT IS SELECTIVE OR AT
LEAST PREFERENTIAL TO SECOND MATERIAL OF
SECOND PATTERNED REGION AS COMPARED TO FIRST
DIRECTED SELF ASSEMBLY ALIGNMENT PROMOTION
MATERIAL OVER FIRST PATTERNED REGION
(OPTIONAL) ⎯427

FIG. 4

NON-LITHOGRAPHICALLY PATTERNED DIRECTED SELF ASSEMBLY ALIGNMENT PROMOTION LAYERS

This is a Continuation of application Ser. No. 14/778,562 filed Sep. 18, 2015 which is a U.S. National Phase application under 35 U.S.C. §371 of International Application No. PCT/US2013/048307, filed Jun. 27, 2013 which is hereby incorporated by reference.

BACKGROUND

Field

Embodiments relate to the field of directed self assembly. In particular, embodiments relate to aligning or positioning structures formed through directed self assembly.

Background Information

Integrated circuits generally include interconnect structures to electrically couple circuitry formed in a semiconductor substrate (e.g., transistors and other circuit elements) with an external signaling medium (e.g., a package, pins, printed circuit board, etc.). Often multi-layer interconnect structures are employed that include multiple levels of generally coplanar metal or other interconnect lines disposed within a dielectric or insulating layer. Vias are generally used to provide select electrical couplings between interconnect lines on different levels by providing electrically conductive paths through the dielectric or insulating materials between the interconnect lines on the different levels.

The metal lines and vias are typically formed by a process that uses lithographic patterning to define their locations and dimensions. In the case of copper interconnect lines commonly found in many modern day processors, a dual damascene type of process is generally employed. Representatively, in one such process, a photoresist layer may be spin coated over a dielectric layer over a substrate, often with thin hard mask layer in between to facilitate etch transfer. Openings for the vias may initially be patterned in the photoresist layer by exposing the photoresist layer to patterned actinic radiation through one or more patterned masks and developing the photoresist layer to form the openings for the vias. The lithographically defined openings for the vias may then be used as an etch mask to etch openings for the vias in the underlying dielectric layer. Subsequently, openings for the metal lines may similarly be formed lithographically in the photoresist layer. The lithographically defined openings for the metal lines may be used as an etch mask to etch trenches or line openings for the metal lines in the underlying dielectric layer. Metal (e.g., one or more barrier layers, bulk copper, etc.) may be introduced into the openings for the vias and the metal lines that have been formed in the dielectric layer. Chemical mechanical polishing (CMP) is commonly used to remove excess metal residing outside of the metal lines. Such a process may generally be repeated to form the additional overlying levels of vias and interconnect lines. Generally, lithography is used to position and align the vias and interconnect lines of an upper/overlying level relative to those on the adjacent lower/underlying level.

There has been a general past and present trend toward ever decreasing sizes and spacing of interconnect structures for at least certain types of integrated circuits (e.g., processors, chipset components, graphics chips, etc.). It is likely that in the future the sizes and spacing of interconnect structures will continue to progressively decrease. One measure of the size of the interconnect structures is their critical dimensions (e.g., the line widths or the widths of the via openings). One measure of the spacing of the interconnects is the pitch (e.g., the line pitch and/or the via pitch). The pitch may represent the center-to-center distance between the closest adjacent interconnect structures (e.g., adjacent lines or adjacent vias).

When patterning extremely small interconnect structures and/or interconnect structures at extremely small pitches by such lithographic processes, several challenges tend to present themselves, especially when the pitches are around 50 nanometers (nm) or less and/or when the critical dimensions of the lines and/or vias are around 20 nm or less. One potential challenge is that the overlay between the vias and the overlying interconnects, and the overlay between the vias and the underlying landing interconnects, generally need to be controlled to high tolerances. As pitches (e.g., via pitches) scale ever smaller over time, the overlay tolerances tend to scale with them at an even greater rate than lithographic equipment is able to keep up.

Another potential challenge is that the critical dimensions of the openings (e.g., the via openings) generally tend to scale faster than the resolution capabilities of the lithographic scanners. Shrink technologies exist to shrink the critical dimensions of the openings. However, the shrink amount tends to be limited by the minimum pitch, as well as by the ability of the shrink process to be sufficiently optical proximity correction (OPC) neutral, and to not significantly compromise line width roughness (LWR) and/or critical dimension uniformity (CDU).

Yet another potential challenge is that the LWR and/or CDU characteristics of photoresists generally need to improve as the critical dimensions decrease in order to maintain the same overall fraction of the critical dimension budget. However, currently the LWR and/or CDU characteristics of most photoresists are not improving as rapidly as the critical dimensions are decreasing.

BRIEF DESCRIPTION OF THE SEVERAL VIEWS OF THE DRAWINGS

The invention may best be understood by referring to the following description and accompanying drawings that illustrate embodiments of the invention. In the drawings:

FIG. 4 is a block flow diagram of an embodiment of a method of forming a directed self assembly alignment promotion layer by performing one or more reactions that are selective or at least preferential to one material over another.

DETAILED DESCRIPTION

In the following description, numerous specific details are set forth, such as, for example, specific materials, reactions, material deposition and removal approaches, orders of operations, and the like. However, it is understood that embodiments of the invention may be practiced without these specific details. In other instances, well-known structures and techniques have not been shown in detail in order not to obscure the understanding of this description.

Figure 1:
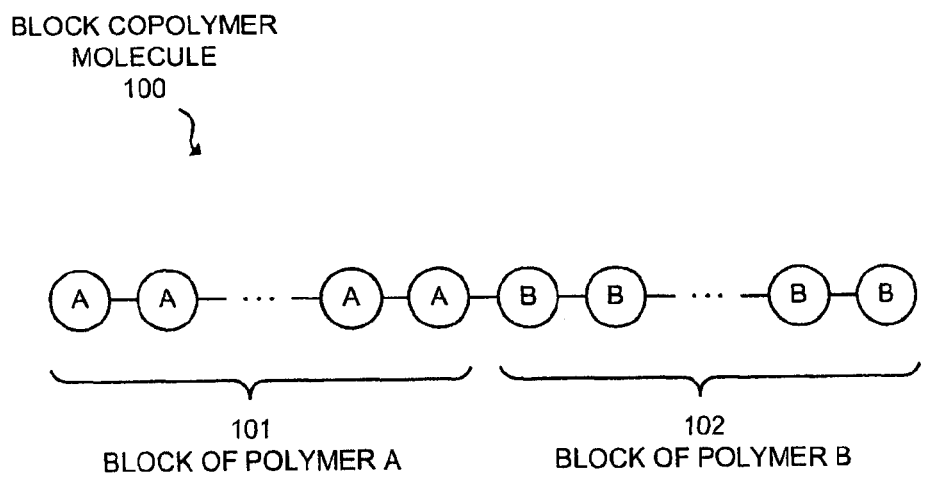
FIG. 1 illustrates a block copolymer molecule suitable for embodiments.

Some embodiments pertain to directed self assembly of block copolymers. FIG. 1 illustrates a block copolymer molecule 100 suitable for embodiments. The block copolymer molecule is a polymeric molecule formed of a chain of covalently bonded monomers. In a block copolymer molecule, there are at least two different types of monomers. Moreover, there are typically at least two blocks or contiguous sequences of monomers having different monomer compositions. The illustrated block copolymer molecule includes a block of polymer A 101 and a block of polymer B 102. The block of polymer A includes predominantly a chain of covalently linked monomer A (e.g., A-A-A-A-A . . . ), whereas the block of polymer B includes predominantly a chain of covalently linked monomer B (e.g., B-B-B-B-B . . . ). The block of polymer A and the block of polymer B are covalently bonded together. The monomers A and B may represent any of the different types of monomers used in block copolymers known in the arts. As one specific example, the monomer A may represent monomers for polystyrene, and the monomer B may represent monomers for poly(methyl methacrylate) (PMMA). In the illustrated example, each block only includes one type of monomer, although in other embodiments, at least one of the blocks may include two or more different types of monomers.

Typically, the polymer blocks (e.g., the block of polymer A and the block of polymer B) may each have different chemical properties. As one example, one of the blocks may be relatively more hydrophobic (e.g., water disliking) and the other relatively more hydrophilic (water liking). Such differences in chemical properties (e.g., a hydrophilic-hydrophobic difference or otherwise) may cause the block copolymer molecules to microphase separate or self-assemble into different regions, domains, or microphases. The differences in hydrophilicity or other chemical properties between the polymer blocks may cause a microphase separation where the different polymer blocks try to "separate" from each other due to their dissimilar chemical properties. However, because the polymer blocks are covalently bonded to one another, they cannot completely "separate" on a macroscopic scale. Rather, the polymer blocks of the same type belonging to different molecules may tend to realign or reposition themselves and segregate or conglomerate in extremely small (e.g., nano-sized) regions, domains, or microphases. The size and shape of these domains generally depends in part upon the relative lengths of the polymer blocks. By way of example, if one polymer block is shorter than the other, but not too much shorter, the block copolymer molecules may align to form columnar structures with the shorter polymer blocks separated into the interior of the columns and the longer polymer blocks surrounding the columns.

One challenge in directed self assembly of block copolymers is controlling the locations or positions at which the assembled structures are formed during the self assembly. For one thing, the underlying surface on which the self assembly is performed generally tends to influence the positions of the assembled structures. In some embodiments, the underlying surface may have different materials. In some cases, the different materials may tend to promote undesirable positions for the assembled structures. In other cases, the different materials may not have a sufficient or at least a non-ideal influence on the positions of the assembled structures. For example, in the case of interconnect structures, the metal and dielectric materials may not have ideally different chemical properties to achieve the desired level of control over the positions of the assembled structures. Furthermore, in some cases, the chemical properties of the underlying surface may potentially vary from one region to another in a way that is difficult to control and/or that depends on conditions during one or more preceding process operations.

Figure 2:
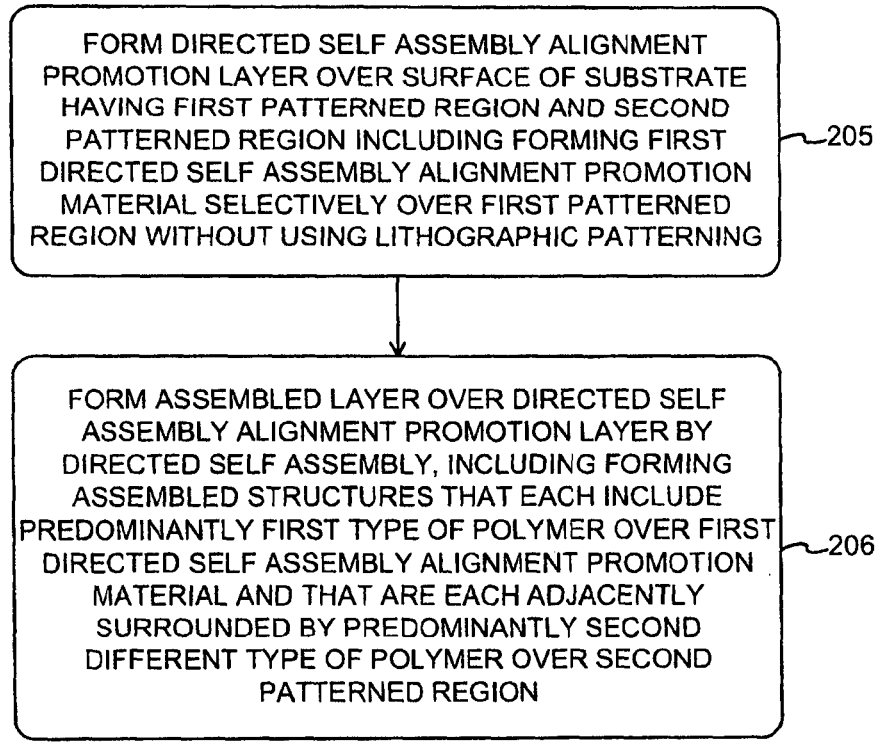
FIG. 2 is a block flow diagram of an embodiment of a method of promoting positioning or alignment of assembled structures during self assembly.

FIG. 2 is a block flow diagram of an embodiment of a method 204 of promoting the positioning or alignment of assembled structures during self assembly of two or more different polymers. The method includes forming a directed self assembly alignment promotion (DSAAP) layer over a surface of a substrate having a first patterned region and a second patterned region, at block 205. The DSAAP layer includes a first DSAAP material formed selectively over the first patterned region. In some embodiments, the first DSAAP material is not substantially formed over the second patterned region (e.g., not formed over more than about 10% of the second patterned region). In practice there may be some slight encroachment of the first DSAAP material over the second patterned region, although the amount is generally expected to be relatively small. However, the first DSAAP material may be substantially aligned over the first patterned region and reflect the boundary between the first and second patterned regions.

In some embodiments, the first DSAAP material may be formed selectively over the first patterned region without using lithographic patterning. In some embodiments, the first patterned region itself may be used to align or form the first DSAAP material selectively over the first patterned region. As one example, in some embodiments, the first and second patterned regions may include different types of materials, and the first DSAAP material may include a product of a reaction of a precursor material that is capable of reacting selectively, or at least preferentially, with a material of the first patterned region as compared to a different material of the second patterned region. As another example, in some embodiments, the first and second patterned regions may be at different heights (e.g., one region may be recessed relative to the other), and the height difference may be used to align or form the first DSAAP material selectively over the first patterned region. As yet another example, in some embodiments, one of the first and second patterned regions may have deeper pores than the other, the first DSAAP material may be introduced into the deeper pores, and then chemical mechanical polishing or etching may be used to remove all of the first directed self assembly except that deepest within the pores. Accordingly, in some embodiments, a boundary of the first patterned region may be used to align or form the first DSAAP material selectively over the first patterned region and/or may be "carried up into" the pattern of the first DSAAP material.

An alternate possible approach would be to use lithographic patterning to form the first DSAAP material selectively over the first patterned region. For example, this may involve depositing a layer of the first DSAAP material. Then the layer may be lithographically patterned by lithographically exposing the layer to patterned actinic radiation with one or more masks and then removing a patterned portion of the layer based on the lithographically patterned exposure. However, especially when patterning extremely small dimensions and/or pitches, such use of lithography may tend to have the drawbacks mentioned in the background section. Moreover, such use of lithography does not natively/naturally utilize the boundary of the underlying first patterned region, to align or form the first DSAAP material selectively over the first patterned region. Finally, additional lithography operations tend to add significantly to the cost of the overall process and may tend to involve overlay errors.

The DSAAP layer and/or the first DSAAP material may be used to expose different chemical properties than those of the underlying surface to the two or more different polymers subsequently to be self assembled thereon. In some embodiments, the alignment promotion layer and/or material may be used to expose chemical properties that are better suited for achieving the intended/desired positions of the assembled polymer structures than those of the underlying surface. For example, the alignment promotion layer and/or material may be used to expose chemical properties (e.g., hydrophilicity, hydrophobicity, water contact angles, etc.) that are more similar to one or more of the different types of polymers than those of the underlying surface. As another example, the alignment promotion layer and/or material may be used to expose chemical properties that are relatively more different than those of the underlying surface. In some embodiments, the first DSAAP material may have a greater chemical affinity for a first type of polymer than the underlying surface has for any of the polymers to be assembled thereon.

Referring again to FIG. 2, the method also includes forming an assembled layer over the DSAAP layer by directed self assembly, at block 206. In some embodiments, this may include forming assembled structures that each include predominantly (e.g., more than 70% by volume) a first type of polymer over the first DSAAP material. The assembled structures may each be adjacently surrounded by predominantly (e.g., more than 70% by volume) a second different type of polymer over the second patterned region. The DSAAP layer and/or the first DSAAP material may chemically affect and help to align or position the first polymer and optionally the second polymer during the self assembly. For example, the first DSAAP material may help to expose favorable surface energy conditions to cause the first type of polymer to segregate, conglomerate, or microphase separate thereon as opposed to over the second patterned region. As a result, the first type of polymer may selectively or preferentially position or align over the first DSAAP material as opposed to over the second patterned region. Advantageously, this may help to transfer or recreate the underlying first patterned region (e.g., its dimensions and/or its pitch) into the overlying assembled structures of the assembled layer.

The sizes of the assembled structures (e.g., their critical or cross-sectional dimensions) need not be defined lithographically, but rather may depend largely on the properties of the polymers (e.g., the lengths of the polymer blocks). In some embodiments, the assembled structures may be used to form extremely small structures (e.g., interconnect structures) and/or structures at extremely small pitches. For example, in some embodiments, the assembled structures may be used to form interconnect structures having critical dimensions of about 20 nm or less and/or interconnect structures at pitches of about 50 nm or less. Such extremely small structures and/or pitches generally tend to present challenges for lithography. Other embodiments are not limited to such small sizes and/or pitches.

FIGS. 3A-E are cross-sectional views at different stages of an embodiment of an approach for forming a DSAAP layer and then forming an assembled layer on the DSAAP layer. The approach utilizes one or more reactions that are selective or at least preferential to one material over another. The features described below for this approach may optionally be used with the method of FIG. 2. Alternatively, this approach may be used with a similar or different method than that of FIG. 2. Moreover the method of FIG. 2 may the same, similar, or different approach and corresponding features.

Figure 3A:
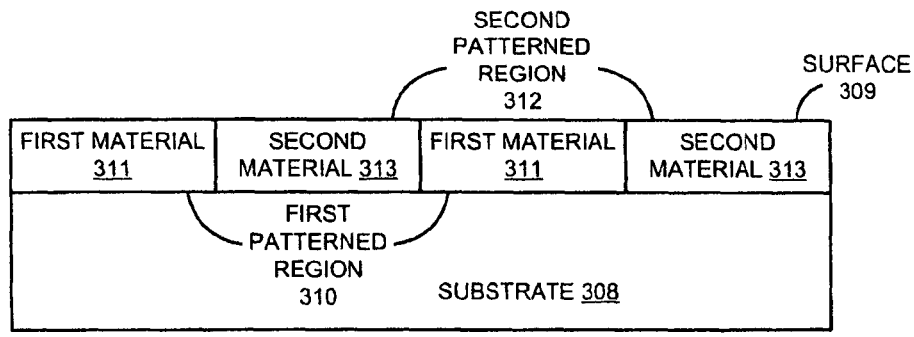
FIGS. 3A-E are cross-sectional views at different stages of an embodiment of an approach for forming a directed self assembly alignment promotion layer utilizing one or more reactions that are selective or at least preferential to one material over another.

FIG. 3A shows a substrate 308. In some embodiments, the substrate may represent a semiconductor substrate. The semiconductor substrate may represent a general workpiece object used to manufacture integrated circuits. The semiconductor substrate often includes a wafer or other piece of silicon or other semiconductor material. Suitable semiconductor substrates include, but are not limited to, single crystal silicon, polycrystalline silicon and silicon on insulator (SOI), as well as substrates formed of other types of semiconductor materials. The semiconductor substrate, depending on the stage of manufacture, often has formed therein transistors, integrated circuitry, and the like. In addition to semiconductors the substrate may also include metals, dielectrics, dopants, and other materials commonly found in integrated circuits. Alternatively, any other types of substrates known to be used for directed self assembly of block copolymers may be used instead (i.e., not limited to only integrated circuit manufacturing).

The substrate 308 has a surface 309. The surface has a first patterned region 310 having a first material 311. The surface also has a second patterned region 312 having a second different type of material. For example, one of the materials may represent a metal or conductive material and another may represent a dielectric material. In other embodiments, other materials and/or three or more different materials may be exposed at the surface. For example, in one alternate embodiment, one of the material may be a cap material over a metal material and the other material may be a dielectric material.

Figure 3B:
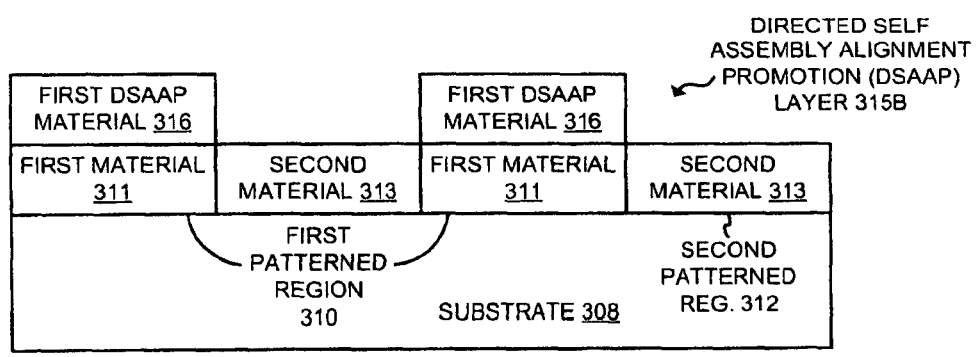

FIG. 3B shows a DSAAP layer 315B formed over the surface 309 of the substrate 308 of FIG. 3A. The DSAAP layer includes a first DSAAP material 316 selectively formed over the first patterned region. As shown, the first DSAAP material is selectively formed over (e.g., on) the first material 311, but not substantially over the second material 313 (i.e., not over more than about 10% of the second material). In practice there may be some slight encroachment of the first DSAAP material over the second material, although the amount is generally expected to be small.

In some embodiments, the first DSAAP material 316 may be selectively formed on the first material 311 by a reaction that is selective, or at least preferential, to the first material 311 as compared to the second material 313. The first DSAAP material may represent a reaction product of a precursor material that reacts selectively or at least preferentially to the first material as compared to the second material. In various embodiments, the reaction may proceed at a greater rate and/or to a greater extent on the first material as compared to on the second material, or a combination thereof.

Figure 3C:
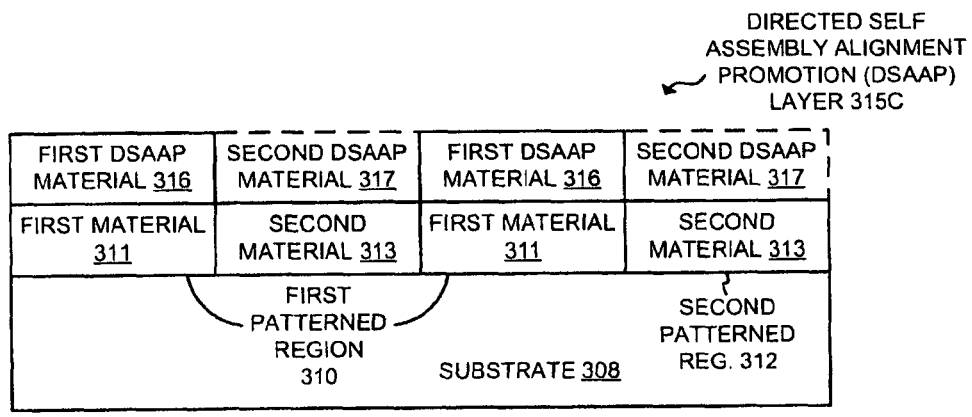

FIG. 3C shows an optional second DSAAP material 317 formed in the DSAAP layer 315B of FIG. 3B to form DSAAP layer 315C. The second DSAAP material 317 is selectively formed over the second patterned region 312. As shown, the second DSAAP material may be selectively formed over (e.g., on) the second material 313, but not substantially over the first material 311 (i.e., generally not more than about 10%).

In some embodiments, the second DSAAP material 317 may represent a reaction product of a precursor material that reacts selectively or preferentially to the second material 313 as compared to the first DSAAP material 316, which is over the first patterned region 310. The increased selectivity and/or preferentiality may be based on a greater reaction rate, a greater extent of reaction, or a combination thereof. The second DSAAP material 317 is optional. In other embodiments, the first DSAAP material 316 may be able to achieve the desired positioning or alignment. For example, the second material may already have sufficient chemical attributes and/or it may be sufficient to attract, align, or position one but not both of the polymers with the first DSAAP material 316.

Figure 3D:
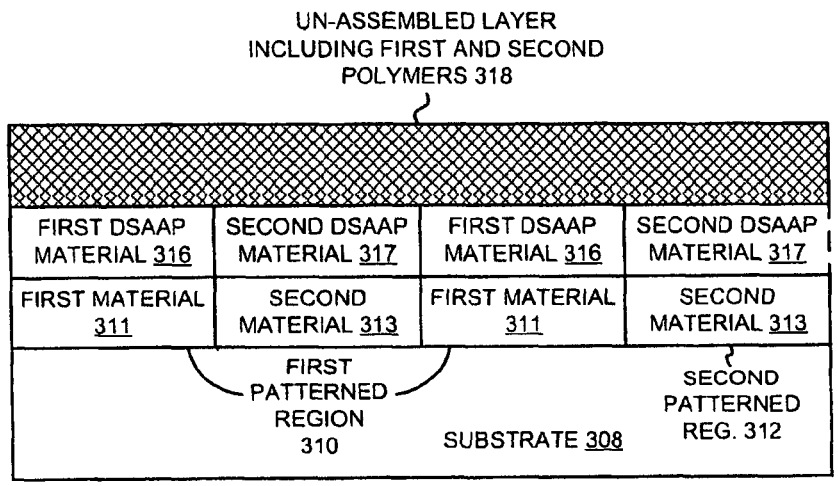

FIG. 3D shows an un-assembled layer 318 including a first polymer and a second different type of polymer formed over the DSAAP layer 315C of FIG. 3C. In some embodiments, the un-assembled layer may include a layer of a block copolymer material. The un-assembled layer may be applied in a variety of different ways. By way of example, a block copolymer material may be dissolved in a solvent and then coated or applied over the surface, for example by spin coating, dip coating, immersion coating, spray coating, or other approaches used for block copolymer layers. In this un-assembled form the block copolymer has not yet substantially phase separated and/or self-assembled to form structures but rather the positions and orientations of the polymer blocks are substantially randomized.

Figure 3E:
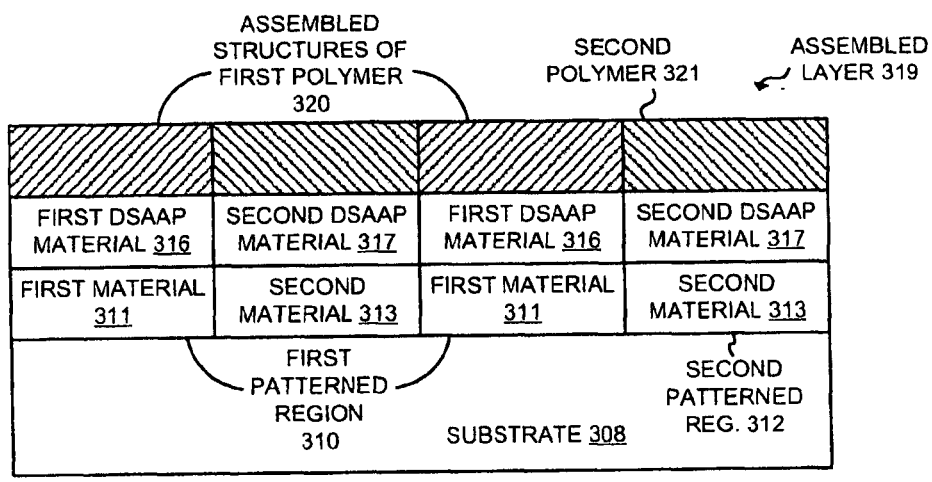

FIG. 3E shows an assembled layer 319 formed from the un-assembled layer 318 of FIG. 3D. The assembled layer includes a plurality of assembled structures 320 over the first DSAAP material 316. Each of the assembled structures include predominantly (e.g., at least 70%) a first type of polymer over the first DSAAP material. Each of the assembled structures is adjacently surrounded by predominantly (e.g., at least 70%) a second different type of polymer 321 over the second patterned region 317.

In some embodiments, the first DSAAP material 316 may have a greater chemical affinity for the first type of polymer 320 than the first material 311 has for either the first 321 or second 321 types of polymers. The first DSAAP material 316 may have a greater chemical affinity for the first type of polymer 320 than for the second type of polymer 321. In one particular example, the first and second polymers may represent a polystyrene-(poly(methyl methacrylate)) block copolymer. Polystyrene (PS) is more hydrophobic than poly(methyl methacrylate) or PMMA. Polystyrene has a water contact angle of about 90°. PMMA has a water contact angle of about 70°. In some embodiments, one of the DSAAP materials may have a water contact angle within about +/−5°, about +/−3°, or about +/−1°, of one of the polymer blocks (e.g., polystyrene) and the other DSAAP material may have a water contact angle within about +/−5°, about +/−3°, or about +/−1°, of the other polymer block (e.g., PMMA).

The assembled structures may be formed by self assembly or microphase separation as described elsewhere herein. In some embodiments, the un-assembled layer may be heated and/or its temperature increased to initiate, accelerate, increase the quality of, or otherwise promote microphase separation and/or self-assembly. For example, this may be achieved by baking the substrate, heating the substrate in an oven, heating the un-assembled layer with a thermal lamp, applying infrared radiation to the un-assembled layer, or otherwise applying heat to and/or increasing the temperature of un-assembled layer. The heating or increased temperature may provide energy to make the block copolymer molecules more mobile/flexible and able to reposition. The amount of heat applied and/or the maximum temperature should generally be sufficient to achieve the microphase separation and/or self-assembly without damaging the polymers or any other important thermally sensitive materials or structures. Commonly, the desired temperature may range between about 150° C. to about 350° C., or between about 170° C. to about 300° C., but not exceeding any significant thermal degradation limits.

Advantageously, the first DSAAP material 316 is aligned relative to the different underlying patterned material boundaries (e.g., aligned relative to the first material 311). The first DSAAP material 316 may help to align or position the assembled structures 320 of the first polymer relative to it. As a result, by extension, the assembled structures may be aligned relative to the different underlying patterned material boundaries (e.g., aligned relative to the first material 311). This alignment does not need to rely on lithography for the patterning of the first DSAAP material. In some embodiments, the assembled structures may be processed further and used to form other structures, such as, for example, interconnect structures, microelectromechanical systems (MEMS), nanowires, or other structures.

FIG. 4 is a block flow diagram of an embodiment of a method 425 of forming a DSAAP layer by performing one or more reactions that are selective or at least preferential to one material over another. In some embodiments, the method of FIG. 4 may be used in the method of FIG. 2 and/or with the approach of FIG. 3A-E. Alternatively, the method of FIG. 4 may be used in a similar or different method or approach. Moreover, the method of FIG. 2 and/or the approach of FIG. 3A-E may use a similar or different method than that of FIG. 4.

The method includes forming a first DSAAP material selectively over a first patterned region, but not substantially over a second patterned region, at block 426. In some embodiments, this includes performing a reaction that is preferential, or at least selective, to a first material of the first patterned region as compared to a second different material of the second patterned region.

The method includes optionally forming a second different DSAAP material selectively over the second patterned region, but not substantially over the first patterned region, at block 427. In some embodiments, this includes performing a reaction that is preferential, or at least selective, to the second material of the second patterned region as compared to the first DSAAP material over the first patterned region.

To further illustrate certain concepts, it may be helpful to consider a few illustrative examples. In some cases one of the materials may be a dielectric material and the other material may be a metal material, or a polymer material or other material that doesn't react with aminosilanes, halosilanes, or alkoxysilanes. Aminosilanes, halosilanes (e.g., chlorosilanes, fluorosilanes, etc.), and alkoxysilanes (e.g., methoxysilanes, ethoxysilanes, and other alkoxysilanes) are able to react selectively or at least preferentially with hydroxylated groups on the surface of the dielectric material as compared to the metal material. Specific examples of suitable silanes include, but are not limited to, trichlorooctadecylsilane, octadecylchlorosilane, diethylaminotrimethyl silanes, bis(dimethylamino)dimethylsilane, methoxysilanes, ethoxysilanes, and other similar silanes, and combinations thereof. Reaction products of these reactions may be used to selectively cover the exposed surface of the dielectric material. If a certain generally lesser amount of reaction does occur on the metal material it may be removed, for example, by a wash with water. The silanes may include one or more other groups, such as, for example, straight alkane chains, branched alkane chains, other straight or branched organic chains, benzylic groups, or other groups, or various other known functional groups, in order to alter the chemical properties of the silanes and achieve the final desired chemical properties or affinities (e.g., hydrophilicity or hydrophobicity) for the surface coating. As another example, bi-functional, tri-functional, multi-functional electrophiles, or a combination thereof, may be reacted with hydroxylated groups of a material (e.g., an ILD) followed by reaction with functional group of a polymer with the resulting activated reaction product.

As another example of a reaction that is selective to a dielectric material, vapor priming with hexamethyldisilazane (HMDS) is able to react with the generally hydrophilic surface of the dielectric material and attach about a monolayer of trimethylsilyl groups to yield a water contact angle in the range of about 50° to about 60°. In some embodiments, a second component may be used to alter this contact angle and/or to achieve a different range of contact angles depending on the relative amounts of the two components. For example, the relatively more reactive component diethylaminotrimethylsilazane (DEATS) may be included along with HMDS in varying amounts to increase the water contact angle anywhere from around 50° to about 60° to around 80°. The number of cycles and/or the amount of material allowed to react generally provides another way to control the final properties (e.g., water contact angle) of the layer. In addition, the DEATS may also potentially help to increase the selectivity or preferentiality over the metal surface, polymer, or other surface. In addition to vapor priming, such materials may also be applied using a liquid phase.

In some cases one of the materials may be a metal material and the other material may be a dielectric material or a polymer material or other material that doesn't react with phosphonic acids. Various phosphonic acids are able to react selectively or at least preferentially with metal surfaces, either native or oxidized, to form strongly bound metal phosphonates preferentially or even selectively over surfaces of dielectric materials (e.g., oxides of silicon). A specific example of a suitable phosphonic acid is octadecylphosphonic acid. Such surface coatings generally tend to be stable in many organic solvents but may be removed using mild aqueous acid and base solutions. The phosphonic acids may include one or more other groups, such as, for example, straight alkane chains, branched alkane chains, other straight or branched organic chains, benzylic groups, or other groups, or various other known functional groups, in order to alter the chemical properties and achieve the final desired chemical properties or affinities (e.g., hydrophilicity or hydrophobicity) for the surface coating.

Another example of a reaction that is selective or at least preferential to metal materials as compared to dielectric materials or polymer materials or other materials, are various metal corrosion inhibitors, such as, for example those used during chemical mechanical polishing to protect interconnect structures. Specific examples include benzotriazole, other triazole functional groups, other suitable heterocycle groups (e.g., heterocycle based corrosion inhibitors), and other metal corrosion inhibitors known in the arts. In addition to triazole groups, other functional groups may be used to provide the desired attraction or reactivity toward the metals. Various metal chelating agents are also potentially suitable.

Yet another example is that various thiols may alternatively be used to react selectively or at least preferentially with the metal surface as compared to dielectric, polymer, or other surfaces that don't tend to react significantly with thiols. As another example, 1,2,4-triazole or similar aromatic heterocycle compounds may be used to react selectively with the metal as compared to dielectic and certain other materials.

In some cases one of the materials may be a metal material or a dielectric material and the other material may be a polymer material or other material that doesn't react with polymer brush materials. The polymer brush materials may represent or be regarded as polymers with one or more reactive functional groups at or near one end thereof such that they are operable to react with a surface generally at or near that end. Various polymer brush materials commonly have terminal hydroxyl groups, amino groups, halo groups, or the like, which may react with hydroxylated groups at the surfaces of the metal or dielectric materials. Polymer materials and certain other materials (e.g., gold, etc.) may not readily react with such polymer brush materials. Therefore, in some cases, selectivity may be achieved.

FIGS. 5A-E are cross-sectional views at different stages of an embodiment of a method of forming a DSAAP layer using different heights of patterned regions, and then forming an assembled layer on the DSAAP layer. The features described below for this approach may optionally be used with the method of FIG. 2. Alternatively, this approach may be used with a similar or different method than that of FIG. 2. Moreover the method of FIG. 2 may the same, similar, or different approach.

Figure 5A:
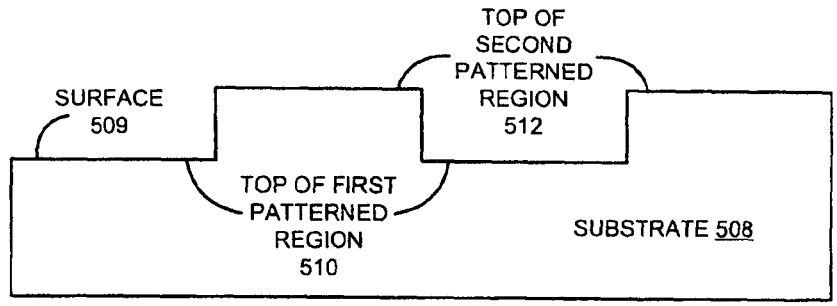
FIGS. 5A-E are cross-sectional views at different stages of an embodiment of an approach for forming a directed self assembly alignment promotion layer using different heights of patterned regions.

FIG. 5A shows a substrate 508. The substrate has a surface 509. The surface includes a top surface of a first patterned region 510 and a top surface of a second patterned region 512. The top surface of the second patterned region is higher than (e.g., has a greater distance from an opposite bottom surface of the substrate) the top surface of the first patterned region. The top surface of the first patterned region is recessed relative to the top surface of the second patterned region. In some embodiments, the first and second patterned regions may have different corresponding types of materials. In other embodiments, the first and second patterned regions may have the same type of material but just at different heights.

Figure 5B:
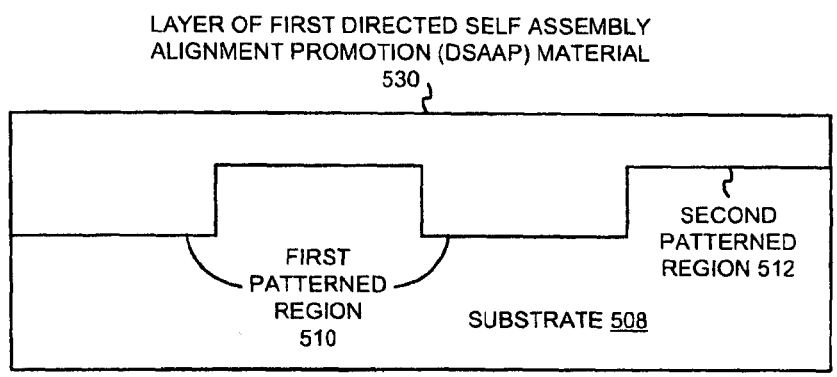

FIG. 5B shows a layer of a first DSAAP material 530 introduced over the top surface 509 of FIG. 5A. The layer is introduced over the top surfaces of both the first and second patterned regions. By way of example, in some embodiments, the recessed first patterned region may have hole openings (e.g., for vias) or trench openings (e.g., for interconnect lines) and the layer may completely fill the hole or trench openings. As before, in some embodiments, the first DSAAP material may have a chemical affinity sufficient to attract, align, or position one of the polymers of a directed self assembly block copolymer. In some embodiments, any of various polymer brush or polymer mat materials known in the arts for directed self assembly of block copolymers may be coated, deposited, or otherwise introduced over the surface. Spin coating, spray coating, dip coating, or various other coating methods are suitable. In other embodiments, other materials may be deposited, coated, applied, grown, or otherwise introduced.

Figure 5C:
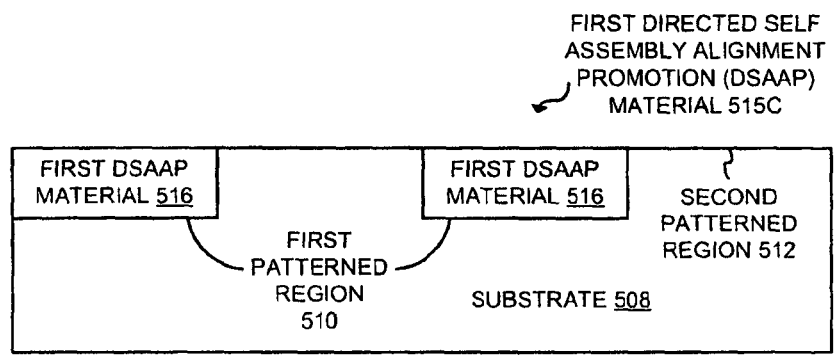

FIG. 5C shows a DSAAP layer 515C formed by removing a portion of the layer of the first DSAAP material 530 of FIG. 5B. As shown, the first DSAAP material has been removed from over the top surface of the second patterned region 512. Another portion of the first DSAAP material 516 remains over the top surface of the first patterned region 510. The portion of the first DSAAP material 516 remains in the recessed portions on and above the first patterned region 510. The removal of this material essentially selectively forms the first DSAAP material over the first patterned region, but not substantially over the second patterned region. Examples of suitable approaches for removing the portion of the layer include, but are not limited to, chemical mechanical polishing (CMP), other planarization approaches, thermal treatments operable to evaporate, vaporize, or otherwise remove material off the surface, etching (e.g., dry etching or wet etching), other top-down material removal methods, and combinations thereof. The top surface of the remaining first DSAAP material 516 may either be substantially coplanar with (e.g., as in the case of CMP), or recessed relative to (e.g., in some cases where over etching is used), the top surface of the second patterned region 512.

Figure 5D:
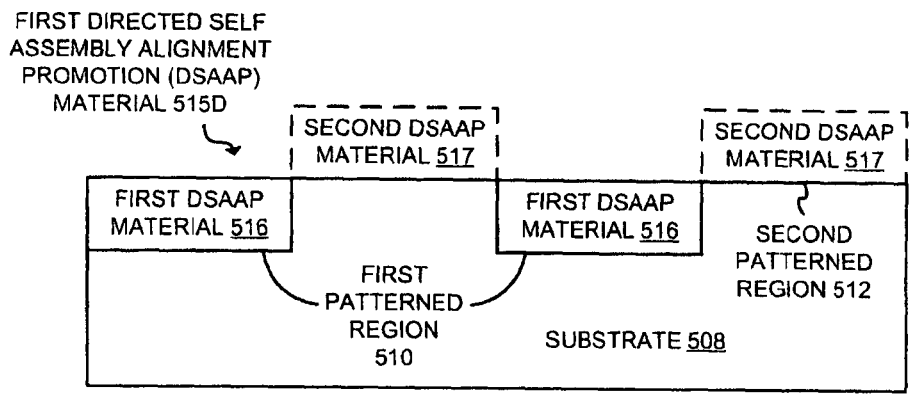

FIG. 5D shows an optional second DSAAP material 517 formed in the DSAAP layer 515C of FIG. 5C to form a revised DSAAP layer 515D. The second DSAAP material 517 is selectively formed over the second patterned region 512, but not substantially over the first patterned region 510 with allowance for some possible slight encroachment. In some embodiments, the second DSAAP material 517 may represent a reaction product of a precursor material that reacts selectively, or at least preferentially, to a material of the top surface of the second patterned region 512 as compared to the first DSAAP material 516, which remains over the top surface of the first patterned region. The increased selectivity and/or preferentiality may be based on a greater reaction rate, a greater extent of reaction, or a combination thereof.

Figure 5E:
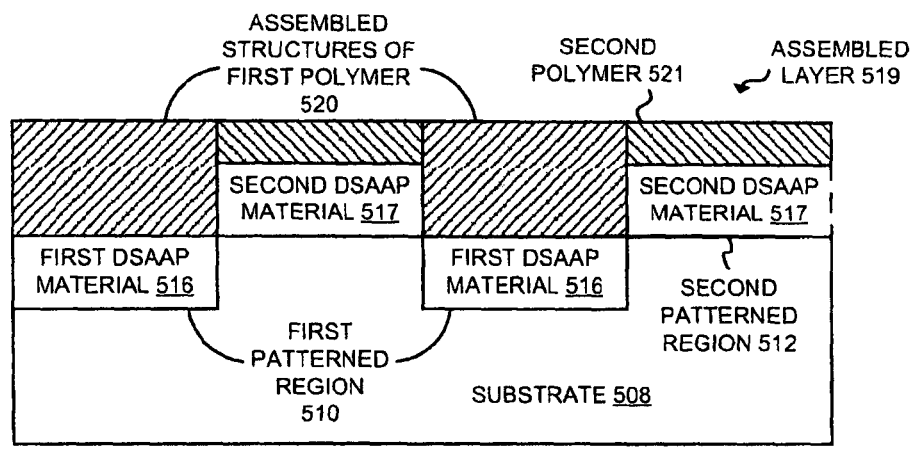

FIG. 5E shows an assembled layer 519 formed over the DSAAP layer 515D of FIG. 5D. The assembled layer includes a plurality of assembled structures 520 over the first DSAAP material 516. Each of the assembled structures include predominantly (e.g., at least 70%) a first type of polymer. Each of the assembled structures is adjacently surrounded by predominantly (e.g., at least 70%) a second different type of polymer 521 over the second patterned region and/or potentially the second DSAAP material. In some embodiments, an un-assembled layer may be coated or otherwise introduced, and then heated to promote self assembly.

Figure 6:
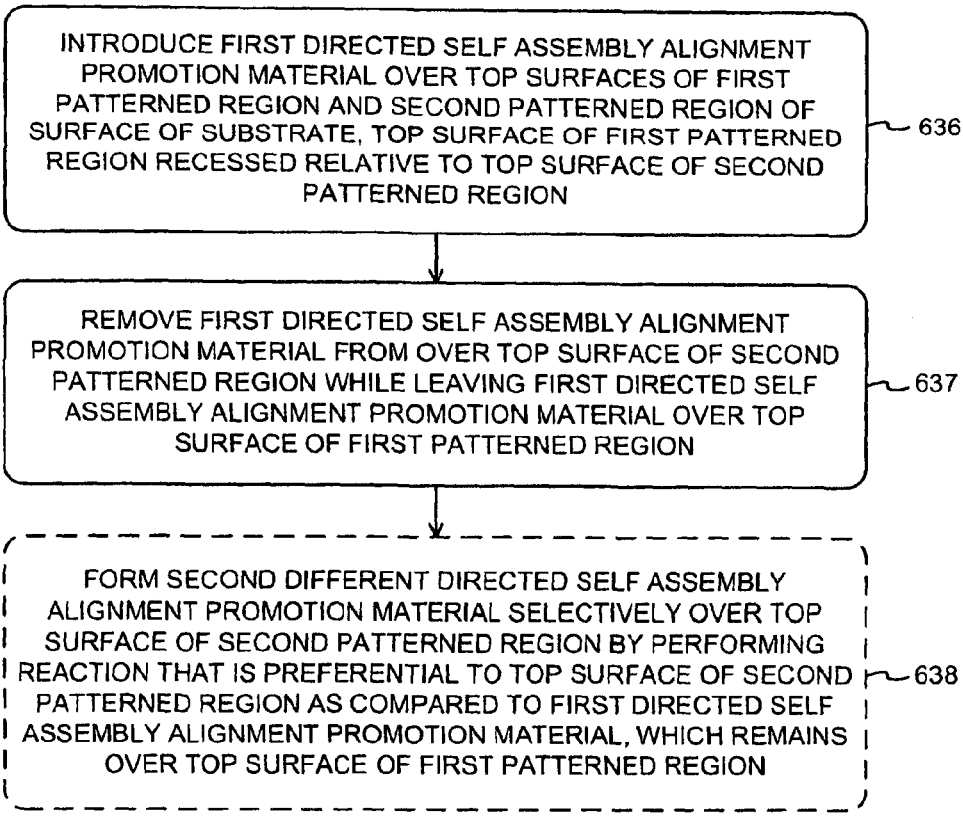
FIG. 6 is a block flow diagram of an embodiment of a method of forming a directed self assembly alignment promotion layer using different heights of patterned regions.

FIG. 6 is a block flow diagram of an embodiment of a method 635 of forming a DSAAP layer using different heights of patterned regions. In some embodiments, the method of FIG. 6 may be used in the method of FIG. 2 and/or with the approach of FIG. 5A-E. Alternatively, the method of FIG. 6 may be used in a similar or different method or approach. Moreover, the method of FIG. 2 and/or the approach of FIG. 5A-E may use a similar or different method than that of FIG. 6.

The method includes introducing a first DSAAP material over a surface of a substrate including over a top surface of a first patterned region that is recessed relative to a top surface of a second patterned region, at block 636. The method also includes removing a portion of the first DSAAP material from over the top surface of the second patterned region, while leaving a portion of the first DSAAP material over the top surface of the first patterned region, at block 637.

The method may also optionally include, forming a second different DSAAP material selectively over the top surface of the second patterned region, after removing the portion of the first DSAAP material from over the top surface of the second patterned region, at block 638. In some embodiments, the second DSAAP material may be formed selectively over the top surface of the second patterned region by performing a reaction that is selective or at least preferential to a material of the top surface of the second patterned region as compared to a the first DSAAP material, which remains over the top surface of the first patterned region. Forming the second different DSAAP material of the second patterned region is optional not required.

Figure 7A:
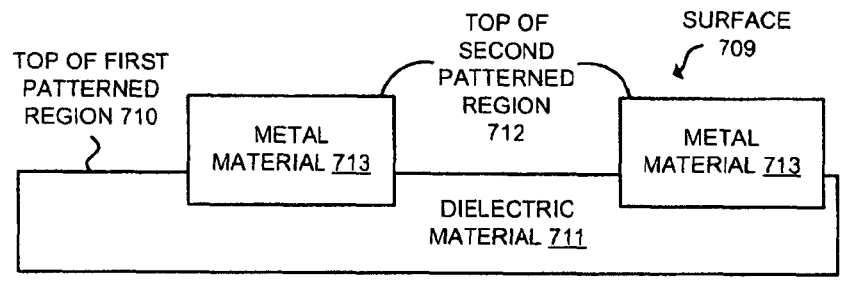
FIGS. 7A-H are cross-sectional views at different stages of a detailed example embodiment of an approach of forming a directed self assembly alignment promotion layer using different heights of patterned regions.

FIGS. 7A-H are cross-sectional views at different stages of a detailed example embodiment of a method of forming a DSAAP layer using different heights of patterned regions. FIG. 7A shows a dielectric or insulating material 711 and a metal material 713. Commonly, the dielectric material may include silicon and oxygen (e.g., any of various oxides of silicon) optionally combined with one or more other materials (e.g., carbon, fluorine, other additives used in low-dielectric constant materials, etc.) and optionally made porous to further decrease the dielectric constant. The metal material may include one or more different metals (e.g., a single metal or an alloy, stacks, layers, an/or other combinations of two or more different metals. In some embodiments, the metal material may include copper potentially alloyed or otherwise combined with one or more other metals.

The metal material is at least partially disposed or embedded within the dielectric material. A top surface of the dielectric material represents a first patterned region 710. A top surface of the metal material represents a second patterned region 712. In the illustrated example, the top surface of the metal material (or the second patterned region) is higher than the top surface of the dielectric material (or the first patterned region). The top surface of the dielectric (or the first patterned region) is recessed relative to the top surface of the metal material (or second patterned region). An alternate arrangement is also possible.

In some embodiments, these surfaces may be recessed by performing an etch. Advantageously, the etch may help to clean up the exposed top surface and/or make it more "pristine" for subsequent reaction with overlying materials. In some embodiments, the metal and dielectric materials may be disposed over a substrate (for simplicity not shown), which may be similar to the other substrates previously described.

Figure 7B:
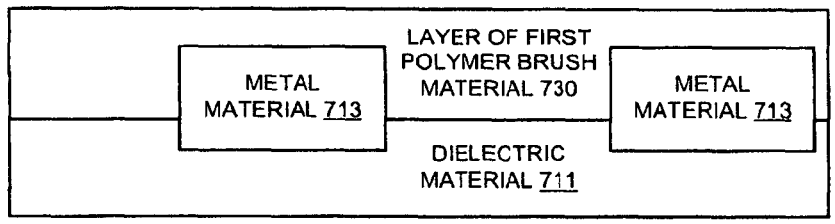

FIG. 7B shows a layer of a first polymer brush material 730 introduced over the top surface 709 of FIG. 7A. In another embodiment, a first polymer mat material may be used. The first polymer brush and/or mat material represents an embodiment of a first DSAAP material. Any of various polymer brush or mat materials may be used. As shown, the layer may be formed generally conformal over both the top surfaces of the metal and dielectric materials at the different heights. The layer may be formed by coating (e.g., dip coating, spray coating, etc.), deposition, or any other suitable approaches for applying polymer brush or mat layers known in the arts.

Figure 7C:
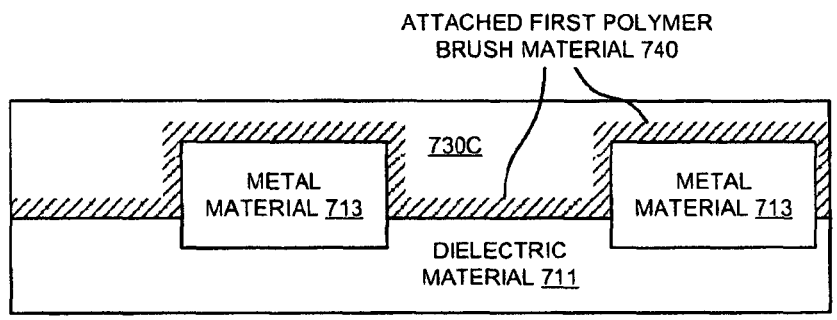

FIG. 7C shows chemically covalently bonding or attaching a first adjoining portion 740 of the polymer brush material or layer 730 to the exposed top surfaces of the metal and dielectric materials of FIG. 7B. In some embodiments, the polymer brush material may have functional groups that may react with exposed functional groups of the exposed top surfaces of the metal and dielectric materials. For example, in some embodiments, amino, halo, alkoxy, or hydroxyl groups of the polymer brush molecules may react with exposed hydroxylated groups of the top surfaces of the metal and dielectric materials. Generally, a relatively thin adjoining layer (e.g., approximately a monolayer) of the polymer brush material may react. In some embodiments, heating or increasing the temperature of the polymer brush material may be used to promote the reaction. As one example, depending upon the particular polymer brush material and process, the temperature of the polymer brush material may be increased to between about 160° C. to about 300° C., or from about 170° C. to about 270° C., without exceeding any significant thermal limits of the materials, structures, or process. The heating may be performed for a time sufficient to perform the reaction to a desired extent, which is often on the order ranging from tens of seconds to several minutes.

Figure 7D:
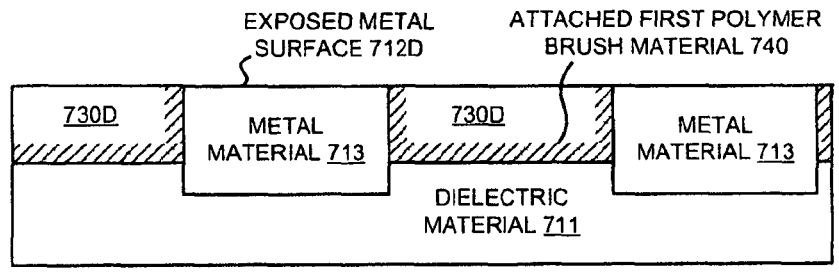

FIG. 7D shows removing a portion of the first polymer brush layer 730C of FIG. 7C to expose top surfaces 712D of one of the patterned layers. In the illustrated example, top surfaces 712D of the metal material 713 are exposed. A portion of the first polymer brush material 730D remains over the top surface of the recessed patterned region, which in the illustrated example is the top surface of the dielectric material 711. Examples of suitable approaches for removing the portion of the layer include, but are not limited to, CMP, other planarization approaches, etching (e.g., dry etching), and other top-down material removal methods. One particular example of a suitable approach, for certain types of polymer brush materials, is a dry etch (e.g., an oxygen etch) for a period of time on the order of several seconds to several tens of seconds. The top surface of the remaining first polymer brush material 730D may either be substantially coplanar with (e.g., as in the case of CMP), or recessed relative to (e.g., in some cases where over etching is used), the top surface of the metal material.

Notice that the portion of the first polymer brush material 730D remaining over the top surface of the recessed patterned region includes two different types of the first polymer brush material. In particular, the portion includes first polymer brush material 740 that is covalently bonded with or attached to the top surfaces of the dielectric material and the vertical sidewalls of the metal material. Also, the portion includes un-reacted or unattached first polymer brush material 730D away from these surfaces of attachment that has not reacted or attached to the metal or dielectric materials. Retaining this un-reacted portion 730D over the reacted or attached portion 740 may help to protect the reacted or attached portion during the etch, CMP process, or other process used to remove the excess first polymer brush material over the top surfaces of the metal material. This may help to keep it pristine for purposes of aligning or positioning self assembly of block copolymers, but is not required.

Figure 7E:
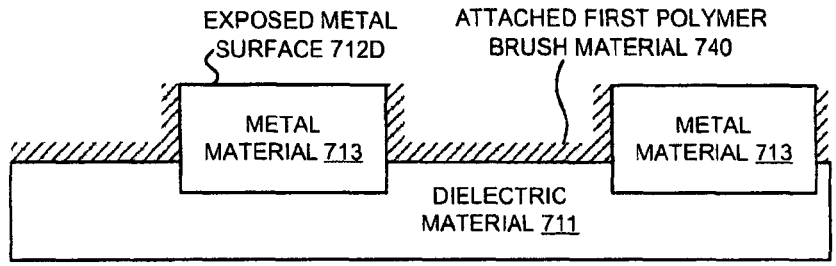

FIG. 7E shows the un-reacted or unattached portion 730D of the first polymer brush material removed from over the attached or reacted portion 740 of the first polymer brush material of FIG. 7D. In some embodiments, the portion may be removed by washing or otherwise contacting the layer with toluene, acetone, or another suitable organic solvent appropriate for the particular type of polymer brush.

Figure 7F:
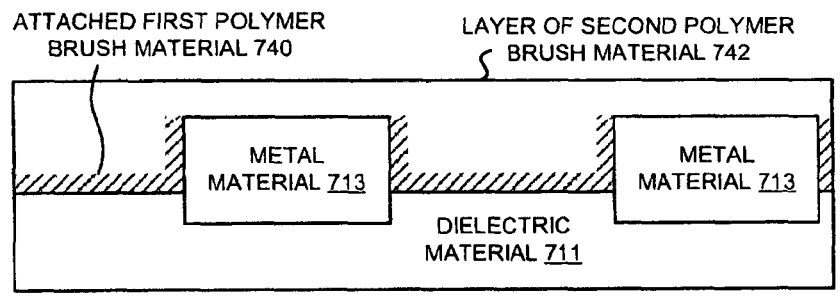

FIG. 7F shows an optional layer of a second different polymer brush material 742 introduced over the top surfaces of FIG. 7E. The second polymer brush material 742 is a different type of material than the first polymer brush material 730 and represents an embodiment of a second different DSAAP material. In one particular example, the first and second polymer materials may be poly(methylmethacrylate) and polystyrene brush materials. As shown, the second polymer brush material is introduced (e.g., coated) on the exposed higher top surfaces 712D of the metal material (in this example) as well as on the top surfaces of the attached first polymer brush material 740.

Figure 7G:
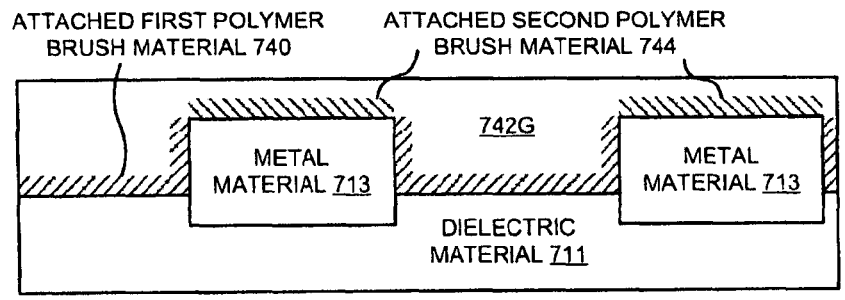

FIG. 7G shows chemically covalently bonding or attaching a first adjoining portion 744 of the second polymer brush material or layer 742 to the exposed top surfaces of the higher (non-recessed) patterned region of FIG. 7F. In the illustrated example, the top surface of the higher (non-recessed) patterned region is the top surface of the metal material. In some embodiments, the second polymer brush material may have functional groups that may react with exposed functional groups of the exposed top surfaces of the metal material. For example, in some embodiments, amino, halo, alkoxy, or hydroxyl groups of the polymer brush molecules may react with exposed hydroxylated groups of the top surfaces of the metal material. Typically, the second polymer brush material will not react with the attached first polymer brush material because the first polymer brush material may lack hydroxylated or other suitable functional groups capable of participating in such reactions. In some embodiments, heating or increasing the temperature of the second polymer brush material may be used to promote the reaction.

Figure 7H:
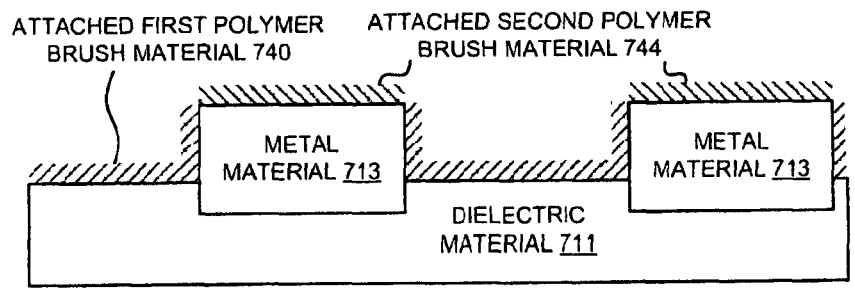

FIG. 7H shows the un-reacted or unattached portion 742G of the second polymer brush material removed from FIG. 7G. The covalently bonded or attached portions 744 remain. In some embodiments, the un-reacted or unattached portion may be removed by washing or otherwise contacting the layer with toluene, acetone, or another suitable organic solvent appropriate for the particular type of polymer brush. The reacted or attached first polymer brush or mat material 740 and the reacted or attached second polymer brush material 744 represent an embodiment of a DSAAP layer. In some embodiments, a layer of a block copolymer, or two or more different un-bonded polymers, may be formed over the DSAAP layer and self assembled as described elsewhere herein.

In the embodiment of FIGS. 7F-H, the second DSAAP material is also a polymer brush material, although this is not required. In other embodiments, other types of materials capable of being formed selectively or at least preferentially on the exposed top surfaces or "mesas" (e.g., the metal material in the illustrated example) as compared to the first polymer brush/mat material may be used instead. For example, in the case of metal materials being exposed, silanes (e.g., amino silanes, halosilanes, alkoxysilanes, hexamethyldisilazane (HMDS), diethylaminotrimethylsilazane (DEATS), combinations thereof, etc.), phosphonic acids (e.g., octadecylphosphonic acid, etc.), or metal corrosion inhibitors (e.g., benzotriazole (BTA), other triazoles, etc.), or thiols, or 1, 2, 4 triazole, or a combination thereof, may be used.

In some embodiments, the assembled structures formed in the assembled layer may be used to form interconnect structures (e.g., metal lines, vias, etc.). Advantageously, since the first and second attached polymer brush materials are aligned relative to the different underlying patterned boundaries (e.g., the different heights of the metal and dielectric materials), and since the first and second attached polymer brush materials help to align or position the assembled structures over them, the assembled structures, as well as the interconnect structures formed from them, may also by extension be aligned or positioned relative to the different underlying patterned boundaries. This may help to improve alignment, without needing to rely on lithography for such alignment, especially when forming extremely small structures or structures at extremely small pitches.

This is just one illustrative embodiment. Many variations are contemplated. As one example, the relative heights of the metal and dielectric materials may be swapped. As another example, materials other than metal and dielectric materials may be used. For example, the same type of material may be used, or two different types of materials besides metal and dielectric materials may be used. As another example, the removal of the un-reacted polymer described for FIG. 7E could optionally be omitted and that un-reacted polymer could be removed with the removal of the un-reacted polymer described for FIG. 7H. As yet another example, the reaction described for FIG. 7C could optionally be omitted and that reaction could be performed with the reaction described for FIG. 7G. Other variations will be apparent to those skilled in the art and having the benefit of this disclosure.

Figure 8A:
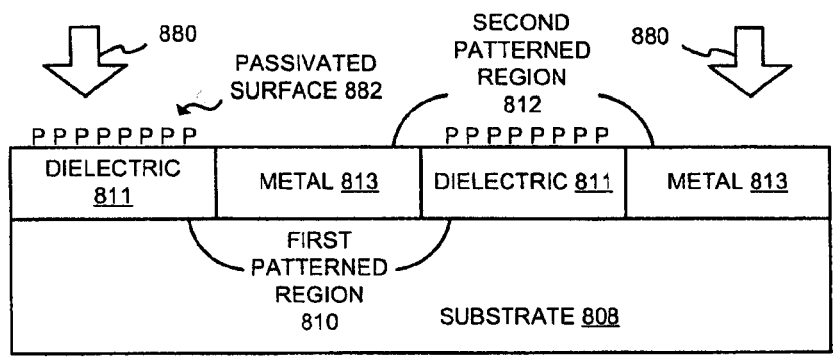
FIGS. 8A-C are cross-sectional views at different stages of an example embodiment of a method of forming a DSAAP layer using a surface passivation treatment.
Figure 8B:
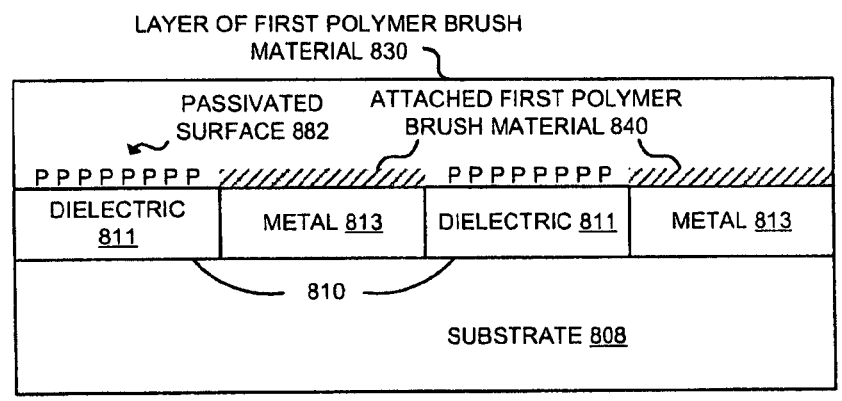
Figure 8C:
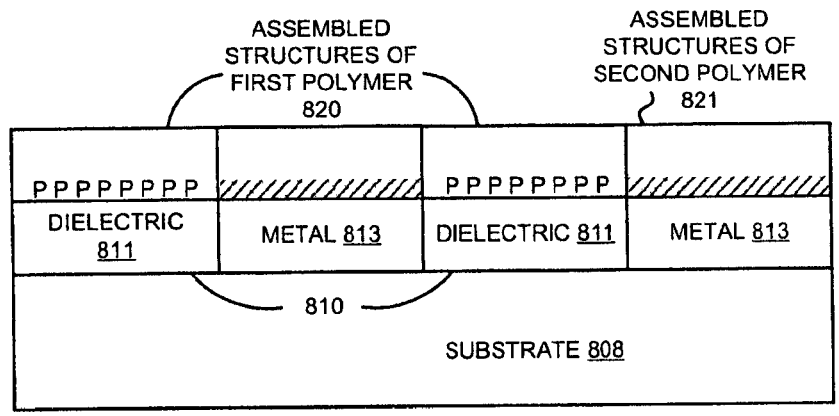

FIGS. 8A-C are cross-sectional views at different stages of an example embodiment of a method of forming a DSAAP layer using a surface passivation treatment. FIG. 8A shows performing a passivation treatment 880 on top surfaces of a dielectric material 811 and a metal material 813 of a substrate 808. In the illustrated embodiment the top surfaces of the dielectric and metal materials are coplanar, although alternatively either one may be recessed relative to the other. A top surface of the dielectric material represents a first patterned region 810. A top surface of the metal material represents a second patterned region 812. The passivation treatment represents a surface treatment that helps to passivate the exposed top surface of the dielectric material 811. In some embodiments, the passivation treatment may passivate or alter the surface of the dielectric material differently (e.g., more or to a greater extent) than the surface of the metal material. As shown, a surface of the dielectric material may represent a passivated surface 882.

Without wishing to be bound by theory, it is presently believed that the passivation treatment may help to remove and/or alter reactive groups exposed at the surface in order to reduce their availability to react with a subsequently to be applied polymer brush material or other DSSAP material. For example, as previously mentioned, dielectric and metal surfaces often have exposed hydroxylated groups that may react with reactive functional groups of polymer brush materials or other DSAAP materials. The passivation treatment may selectively or at least preferentially remove and/or alter the hydroxyl groups of the dielectric surface more than those of the metal surface thereby helping to selectively reduce the reactivity of the dielectric surface to the polymer brush material or other DSAAP material. After the treatment, the metal surface is still able to react with the polymer brush material or other DSAAP material, but the dielectric surface is not able to do so to the same extent.

One example of a suitable passivation treatment is a fluorine-based etch. One specific example of a suitable fluorine based etch is a low-power timed carbon tetrafluoride (CF4) etch, although the scope of the invention is not so limited. Again, without wishing to be bound by theory, it is presently believed that such a fluorine based etch may help to remove hydroxylated groups at the dielectric surface or convert them to less reactive groups, such as, for example, fluoride groups or other fluorine containing groups. Initial results indicate that such a fluoride based etch may be able to selectively significantly reduce the reactivity of the dielectric surface to polymer brush materials without reducing the reactivity of the metal surface to the polymer brush materials to the same extent. After baking, the polymer brush material may be washed off the dielectric surface, for example with an organic solvent wash, without being washed off the metal surface.

In addition, the fluorine based etch may tend to increase the hydropobicity of the dielectric surface. This increased hydrophobicity may be used to make the dielectric surface attract or align hydrophobic polymers, such as, for example, polystyrene. In some cases, this may help to avoid needing to apply a separate additional DSAAP material to the dielectric surface. Alternatively, a separate additional DSAAP material may optionally be applied to the dielectric surface if desired. Moreover, the passivation of the dielectric surface, and making it more hydrophobic, may be done in a single etch operation rather than needing to use multiple operations or multiple layers.

FIG. 8B shows applying a layer of a first polymer brush material 830 over the surface of the substrate of FIG. 8A and attaching a portion 840 of the first polymer brush material to top surfaces of the metal material. The portion 840 of the first polymer brush material is attached or bonded selectively to the metal surface but not to the dielectric surface. The passivation surface 882 may help to prevent the first polymer brush material from attaching over the dielectric surface. In some embodiments, a relatively more hydrophilic polymer brush material, such as, for example, a PMMA polymer brush material, may be used. This may help to make the second patterned region having the metal material align or attract PMMA.

FIG. 8C shows removing the layer of the first polymer brush material 830 from over the surface of the substrate of FIG. 8B. The unreacted polymer brush material may be removed, for example, by washing or contacting the polymer brush material layer with a suitable solvent such as toluene, acetone, poly(ethylene glycol) methylether acrylate (PEGMEA), or other suitable organic solvents. The attached portion 840 of the first polymer brush material remains over the metal surface, but no significant portion of the first polymer brush material may remain over the dielectric surface. Also shown is an assembled layer including assembled structures 820 of a first polymer over the dielectric material and assembled structures 821 of a second polymer over the metal material. As mentioned above, the fluorine based etch or other passivation treatment may make the dielectric surface relatively more hydrophobic such that it may be able to attract or align a relatively more hydrophobic material, such as, for example, polystyrene. In some embodiments, the second polymer material is relatively less hydrophobic, such as, for example, PMMA, which may be attracted by a PMMA polymer brush material over the metal surface. However, the scope of the invention is not limited to just these types of polymers. Moreover, another DSAAP material may optionally be formed over the passivation layer or dielectric material, if desired.

Other embodiments are not limited to using such a fluorine based etch as a passivation treatment. Rather, other embodiments may passivate or otherwise treat the heterogeneous surfaces with other reagents or modification agents that are able to selectively or at least preferentially modify one of the types of surfaces differently than another. For example, in some embodiments, a corrosion inhibitor or metal binding agent may be contacted with the surface to treat the surface of the metal. Examples of suitable corrosion inhibitors or other metal binding agents include but are not limited to, benzotriazole and various other known triazole type corrosion inhibitors, various heterocyclic type corrosion inhibitors, and other metal corrosion inhibitors known in the arts. In some embodiments, the treatment may be performed during a chemical mechanical polishing operation. The treatment may help to make the surface of the metal selectively less reactive to polymer brush materials or other DSAAP materials similarly as described above for the passivation treatment.

Figure 9A:
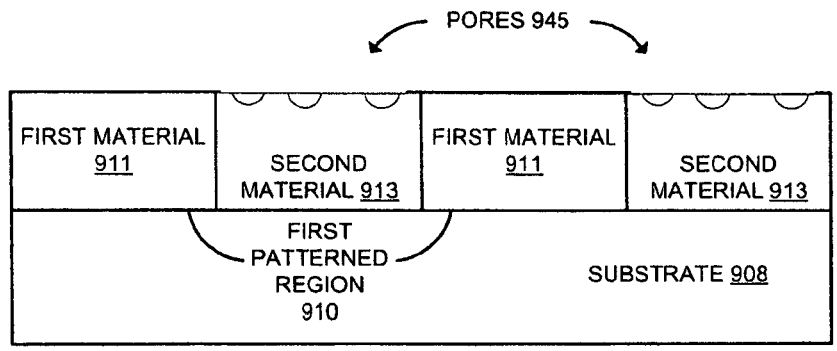
FIGS. 9A-C are cross-sectional views at different stages of an embodiment of an approach for forming a directed self assembly alignment promotion layer utilizing a difference in porosity between materials.
Figure 9B:
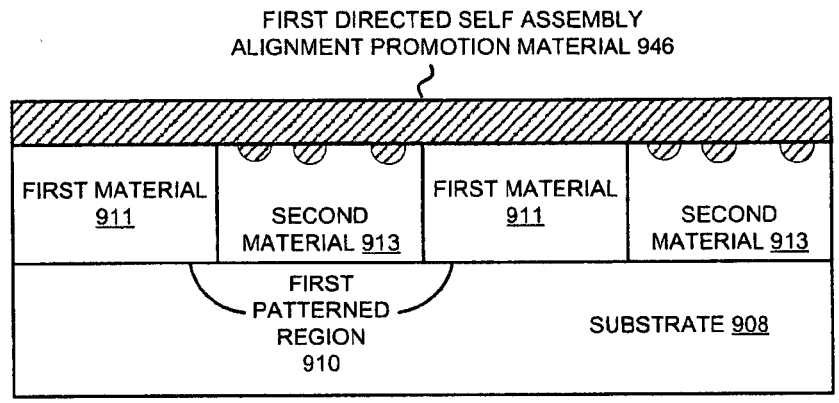
Figure 9C:
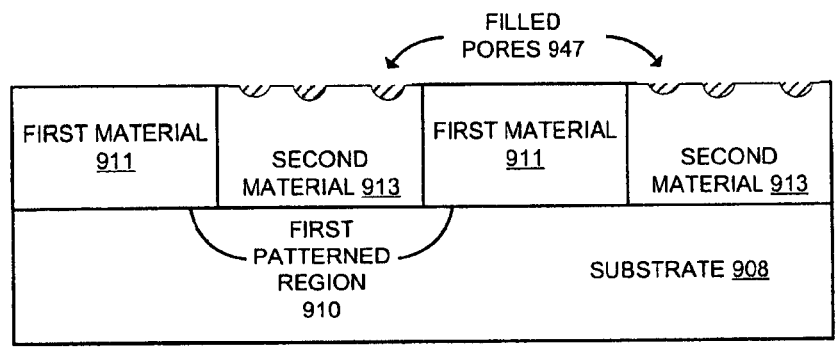

FIGS. 9A-C are cross-sectional views at different stages of an embodiment of an approach for forming a DSAAP layer utilizing a difference in porosity between materials. In some embodiments, this approach may be used with the method of FIG. 2 and/or the approach of FIGS. 3A-E, although this is not required.

FIG. 9A shows a substrate 908 having a first patterned region having a first material 911 and a second patterned region having a second different material 913. The second material has pores 945. In one aspect, either the second material is porous and the first material is substantially non-porous, or in another aspect the second material has deeper pores than the first material. In one particular embodiment, the first material may be a metal material and the second material may represent a dielectric material (e.g., a porous low-k dielectric material).

FIG. 9B shows a layer of a first DSAAP material 946 formed or introduced over the surface of FIG. 9A. The first DSAAP material is introduced also into the pores 945. In some embodiments, the first DSAAP material may have a sufficiently low molecular weight to flow into the pores. In some embodiments, the polymer may be a polymer brush material and/or a polymer mat material and/or another type of polymer material capable of solidifying or crosslinking to help keep the polymer within the pores and/or reduce dissolution in solvents. In a still further embodiment, the polymer may be an ordinary polymer material that need not be capable of reacting with the surface or crosslinking but rather may be flowed into the pores at higher temperature and thereafter solidified.

FIG. 9C shows the portion of the layer 946 of FIG. 9B removed from over the top surface of the first material 911 but another portion of the first DSAAP material remaining within filled pores 947. Examples of suitable approaches for removal of the portion of the layer include, but are not limited to, etching, CMP, other planarization approaches, and other top-down material removal approaches. If desired, another material may optionally be formed over the first material 911 (e.g., using one of the selective reactions described elsewhere herein).

In some embodiments, each of two different DSAAP materials may have chemical properties similar to a corresponding different polymer to be self assembled thereon. For example, a first DSAAP material may have a water contact angle within about +/−5°, or about +/−3°, or about +/−1° of a first polymer, and a second DSAAP material may have a water contact angle within about +/−5°, or about +/−3°, or about +/−1° of a second polymer. For example, brush materials of the same two polymers may be used. In other embodiments, one of the two DSAAP materials may have chemical properties similar to one of the polymers, and the other DSAAP material may have substantially neutral properties that are intermediate or about halfway between the two different polymers. For example, the first DSAAP material may have a water contact angle within about +/−5°, or about +/−3°, or about +/−1° of a first polymer, and the second DSAAP material may have a water contact angle within about +/−5° of the average water contact angle of the two polymers. That is to say, the second DSAAP material may have substantially the same chemical affinity for the two different types of polymers. For example, if the two different polymers are A-A-A-A . . . and B-B-B-B . . . , then suitable neutral polymers could be A-B-A-B-A-B-A-B . . . , and A-A-B-B-A-A-B-B . . . , A-B-B-A-A-B-A-B . . . and the like. The second DSAAP material may be relatively neutral toward the self assembly such that the first DSAAP material primarily affects the positioning of the assembled structures. This may be beneficial when the second DSAAP material occupies relatively larger surface areas than the first DSAAP material. For example, a relatively larger surface area of dielectric material surrounding metal interconnect structures may be made neutral so that the DSAAP material over the metal interconnect structures primarily controls the positioning.

It is to be appreciated that the approaches disclosed herein may be used in various other combinations than those explicitly shown. For example, introduction of a material into a pore may be combined with a selective reaction, a selective reaction may be combined with different pattern heights, pores may be combined with different heights, etc. For simplicity, two different sites (e.g., a metal surface and a dielectric surface) have been shown and described. However, in other embodiments, three or more different sites may optionally be used. Embodiments have been described in the context of forming interconnect structures. However, other embodiments may be used to form semiconductor devices, memory devices, magnetic storage media, nanowires, photonic crystals, quantum dots, microelectromechanical systems (MEMS), or other generally small devices and/or structures.

Figure 10:
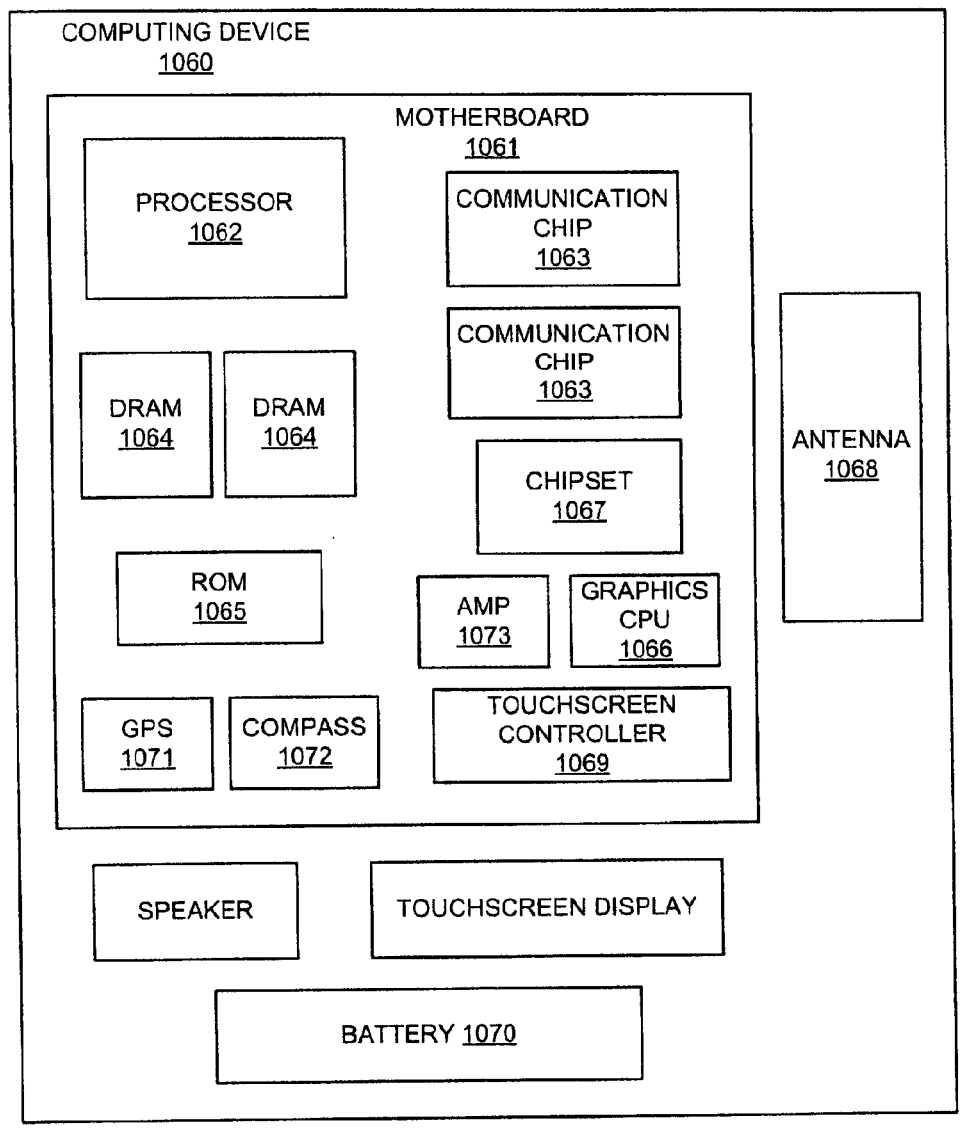
FIG. 10 illustrates a computing device suitable for embodiments.

FIG. 10 illustrates a computing device 1060 in accordance with one implementation of the invention. In various implementations, the computing device may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder.

The computing device has a board 1061. The board may include components including but not limited to a processor 1062 and one or more communication chip 1063. In other implementations, the communication chip may be part of the processor. The communication chip may enable wireless communications. Depending on its applications, the computing device may include other components. Examples of such other components include, but are not limited to, volatile memory (e.g., DRAM) 1064, non-volatile memory (e.g., ROM) 1065, flash memory (not shown), a graphics processor 1066, a digital signal processor (not shown), a crypto processor (not shown), a chipset 1067, an antenna 1068, a touchscreen controller 1069, a battery 1070, an audio codec (not shown), a video codec (not shown), a power amplifier 1073, a global positioning system (GPS) device 1071, a compass 1072, an accelerometer (not shown), a gyroscope (not shown). These and various other components that have integrated circuits may include one or more structures (e.g., interconnect structures) formed using embodiments described herein. Examples include, but are Example Embodiments The following examples pertain to further embodiments. Specifics in the examples may be used anywhere in one or more embodiments.

Example 1 is a fabrication method including forming a directed self assembly alignment promotion layer over a surface of a substrate having a first patterned region and a second patterned region. The forming of the directed self assembly alignment promotion layer includes forming a first directed self assembly alignment promotion material selectively over the first patterned region. The forming of the first directed self assembly alignment promotion material selectively over the first patterned region is optionally performed without using lithographic patterning. The method also includes forming an assembled layer over the directed self assembly alignment promotion layer by directed self assembly. The forming of the assembled layer including forming a plurality of assembled structures that each include predominantly a first type of polymer over the first directed self assembly alignment promotion material and that are each adjacently surrounded by predominantly a second different type of polymer over the second patterned region. The first directed self assembly alignment promotion material has a greater chemical affinity for the first type of polymer than for the second different type of polymer.

Example 2 includes the method of Example 1 and optionally in which the forming of the first directed self assembly alignment promotion material selectively over the first patterned region includes performing a reaction that is preferential to a material of the first patterned region over a second different material of the second patterned region.

Example 3 includes the method of Example 2 and optionally in which one of the material of the first patterned region and the second different material of the second patterned region is a metal material and another is a dielectric material.

Example 4 includes the method of any of Examples 1-3 and optionally in which the performing the reaction includes at least one of: (1) reacting at least one of an aminosilane, a halosilane, and an alkoxysilane with hydroxylated groups of the first patterned region; (2) reacting a functional group of a polymer with the hydroxylated groups of the first patterned region; (3) reacting a phosphonic acid with a metal of the first patterned region; (4) reacting a thiol with the metal of the first patterned region; (5) reacting at least one of triazole and a corrosion inhibitor with the metal of the first patterned region; (6) reacting 1, 2, 4 triazole with the metal of the first patterned region; (7) reacting a heterocycle corrosion inhibitors with the metal of the first patterned region; and (8) reacting a multi-functional electrophile with hydroxylated groups of the first patterned region.

Example 5 includes the method of any of Examples 1-4 and optionally further including, after the forming of the first directed self assembly alignment promotion material selectively over the first patterned region, forming a second different directed self assembly alignment promotion material selectively over the second patterned region but not over the first patterned region.

Example 6 includes the method of Example 5 and optionally in which the forming of the second directed self assembly alignment promotion material selectively over the second patterned region includes performing a reaction that is preferential to the second material of the second patterned region as compared to the first directed self assembly alignment promotion material which is over the first patterned region.

Example 7 includes the method of any of Examples 1 and 3 and optionally in which the forming of the first directed self assembly alignment promotion material selectively over the first patterned region includes introducing the first directed self assembly alignment promotion material over top surfaces of both the first and second patterned regions, the top surface of the first patterned region recessed relative to the top surface of the second patterned region. The forming of the first directed self assembly alignment promotion material selectively over the first patterned region further optionally includes removing the first directed self assembly alignment promotion material from over the top surface of the second patterned region, while leaving the first directed self assembly alignment promotion material over the top surface of the first patterned region.

Example 8 includes the method of Example 7 and optionally in which the removing the first directed self assembly alignment promotion material includes performing at least one of etching and chemical mechanical polishing.

Example 9 includes the method of any of Examples 7-8 and optionally further including, after the forming of the first directed self assembly alignment promotion material selectively over the first patterned region, forming a second different directed self assembly alignment promotion material selectively over the second patterned region, but not over the first patterned region. This optionally includes performing a reaction that is preferential to a material of the top surface of the second patterned region as compared to the first directed self assembly alignment promotion material which remains over the top surface of the first patterned region.

Example 10 includes the method of any of Examples 1-9 and optionally in which the forming of the directed self assembly alignment promotion layer includes forming the first directed self assembly alignment promotion material selectively over a metal material of the first patterned region. The first directed self assembly alignment promotion material optionally has the greater chemical affinity for the first type of polymer than for the second type of polymer. Optionally, the forming of the directed self assembly alignment promotion layer includes forming a second different directed self assembly alignment promotion material selectively over a dielectric material of the second patterned region. The second directed self assembly alignment promotion material optionally has one of a greater chemical affinity for the second type of polymer than for the first type of polymer and a substantially same chemical affinity for the first and second types of polymers.

Example 11 includes the method of Example 1 and optionally in which the forming of the first directed self assembly alignment promotion material selectively over the first patterned region includes optionally introducing the first directed self assembly alignment promotion material over both the first and second patterned regions, the first patterned region is more porous than the second patterned region. The first directed self assembly alignment promotion material is introduced into pores of the first patterned region. The first directed self assembly alignment promotion material is removed from over the second patterned region, while leaving the first directed self assembly alignment promotion material in the pores of the first patterned region.

Example 12 includes the method of any preceding Example and optionally further including forming a second directed self assembly alignment promotion material selectively over the second patterned region but not over the first patterned region.

Example 13 includes the method of any preceding Example and optionally in which the forming of the directed self assembly alignment promotion layer includes is over an interconnect line of one of the first and second patterned regions that has a width of no more than 20 nanometers.

Example 14 is an integrated circuit substrate including a substrate. A surface of the substrate has a first patterned region having a first material and a second patterned region having a second different material. The integrated circuit substrate also includes a directed self assembly alignment promotion layer including a first directed self assembly alignment promotion material selectively over the first patterned region. The integrated circuit substrate also includes an assembled layer over the directed self assembly alignment promotion layer. The assembled layer includes a plurality of assembled structures, each including predominantly a first type of polymer over the first directed self assembly alignment promotion material, and each adjacently surrounded by predominantly a second different type of polymer over the second patterned region. The first directed self assembly alignment promotion material has a greater chemical affinity for the first type of polymer than for the second type of polymer.

Example 15 includes the integrated circuit substrate of Example 14 and optionally in which the first directed self assembly alignment promotion material is a reaction product of a precursor material that is capable of reacting preferentially to the first material as compared to the second material.

Example 16 includes the integrated circuit substrate of any of Examples 14-15 and optionally in which the first material is a metal material and the second material is a dielectric material.

Example 17 includes the integrated circuit substrate of any of Examples 14-16 and optionally in which the first directed self assembly alignment promotion material includes at least one of:

a reaction product of a phosphonic acid with the metal material;

a reaction product of a thiol with the metal material;

a reaction product of at least one of triazole and a metal corrosion inhibitor with the metal material;

a reaction product of a heterocycle corrosion inhibitor with the metal material; and a reaction product of 1, 2, 4 triazole with the metal material.

Example 18 includes the integrated circuit substrate of any preceding Example and optionally in which the first directed self assembly alignment promotion material has the greater chemical affinity for the first type of polymer than for the second type of polymer. Optionally, further including a second different directed self assembly alignment promotion material selectively over the dielectric material. The second directed self assembly alignment promotion material optionally has one of a greater chemical affinity for the second type of polymer than for the first type of polymer and a substantially same chemical affinity for the first and second types of polymers.

Example 19 includes the integrated circuit substrate of any preceding Example and optionally in which the first material is a dielectric material and the second material is a metal material.

Example 20 includes the integrated circuit substrate of Example 19 and optionally in which the first directed self assembly alignment promotion material includes at least one of:

a reaction product of at least one of an aminosilane, a halosilane, and an alkoxysilane with hydroxylated groups of the dielectric material; and a reaction product of a functional group of a polymer with hydroxylated groups of the dielectric material.

Example 21 includes the integrated circuit substrate of any preceding Example and optionally in which the directed self assembly alignment promotion layer includes a second directed self assembly alignment promotion material selectively over the second patterned region but not over the first patterned region.

Example 22 includes the integrated circuit substrate of Example 21 and optionally in which the second directed self assembly alignment promotion material is a reaction product of a precursor material that is capable of reacting preferentially to the second material as compared to the first directed self assembly alignment promotion material.

Example 23 includes the integrated circuit substrate of Example 14 and optionally in which a top surface of one of the first and second patterned regions is recessed relative to a top surface of other, in which the first material is a metal material and the second material is a dielectric material, in which the first directed self assembly alignment promotion material includes a first polymer material, and further including a second different polymer material of the directed self assembly alignment promotion layer selectively over the second patterned region.

Example 24 includes the integrated circuit substrate of any preceding Example and optionally in which the first material is more porous than the second material, and in which the first directed self assembly alignment promotion material is included in pores of the first material.

Example 25 includes the integrated circuit substrate of any preceding Example and optionally in which one of the first and second patterned regions includes an interconnect line having a width of that is no more than 20 nanometers.

Example 26 is a fabrication method including introducing a first directed self assembly alignment promotion material over top surfaces of a first patterned region and a second patterned region of a surface of a substrate, the top surface of the first patterned region recessed relative to the top surface of the second patterned region. The method also includes removing the first directed self assembly alignment promotion material from over the top surface of the second patterned region while leaving the first directed self assembly alignment promotion material over the top surface of the first patterned region. The method also includes after removing the first directed self assembly alignment promotion material from over the top surface of the second patterned region, forming a second different directed self assembly alignment promotion material selectively over the top surface of the second patterned region by performing a reaction that is preferential to the top surface of the second patterned region as compared to the first directed self assembly alignment promotion material, which remains over the top surface of the first patterned region. The method also includes assembling a layer that includes at least two different polymeric materials over the first and second directed self assembly alignment promotion materials.

Example 27 includes the method of Example 26 and optionally in which the introducing includes introducing a first polymer brush material over the top surfaces of the first and second patterned regions. The first polymer brush material includes a polymer with one or more reactive groups proximate one end thereof. The method further includes reacting a portion of the first polymer brush material with the top surfaces of the first and second patterned regions. Optionally, forming the second different directed self assembly alignment promotion material selectively over the top surface of the second patterned region includes reacting a second different polymer brush material with the top surface of the second patterned region.

Example 28 includes the method of Example 27 and optionally further including retaining an un-reacted portion of the first polymer brush material, which has not reacted with the top surface of the first patterned region, over the first patterned region, until after the removal of the first polymer brush material from over the top surface of the second patterned region. Optionally, after the removal of the first polymer brush material from over the top surface of the second patterned region, removing the un-reacted portion of the first polymer brush material from over the first patterned region.

Example 29 includes the method of any of Examples 26-28 and optionally in which one of the top surfaces of the first and second patterned regions includes a metal material and other includes a dielectric material.

Example 30 includes the method of any of Examples 26 and 29 and optionally in which the first and second directed self assembly alignment promotion materials comprise different polymer brush materials, and optionally in which the removing the first directed self assembly alignment promotion material from over the top surface of the second patterned region includes performing at least one of etching and chemical mechanical polishing.

Example 31 is a manufacturing system including means for forming a directed self assembly alignment promotion layer over a surface of a substrate having a first patterned region and a second patterned region. The forming of the directed self assembly alignment promotion layer includes forming a first directed self assembly alignment promotion material selectively over the first patterned region. The forming of the first directed self assembly alignment promotion material selectively over the first patterned region is optionally performed without using lithographic patterning. The manufacturing system also includes means for forming an assembled layer over the directed self assembly alignment promotion layer by directed self assembly. The forming of the assembled layer includes forming a plurality of assembled structures that each include predominantly a first type of polymer over the first directed self assembly alignment promotion material and that are each adjacently surrounded by predominantly a second different type of polymer over the second patterned region. The first directed self assembly alignment promotion material has a greater chemical affinity for the first type of polymer than for the second different type of polymer.

Example 32 includes the manufacturing system of claim 31 and optionally in which the means for forming the first directed self assembly alignment promotion material selectively over the first patterned region includes means for performing a reaction that is preferential to a material of the first patterned region over a second different material of the second patterned region.

Example 33 is an integrated circuit substrate or other apparatus manufactured by the method of any of Examples 1-13.

Example 34 is a manufacturing system to perform the method of any of Examples 1-13.

Example 35 is a manufacturing system including means for performing the method of any of Examples 1-13.

Example 36 is an integrated circuit substrate or other apparatus manufactured by the method of any of Examples 26-30.

Example 37 is a manufacturing system to perform the method of any of Examples 26-30.

Example 38 is a manufacturing system including means for performing the method of any of Examples 26-30.

In the description above, for the purposes of explanation, numerous specific details have been set forth in order to provide a thorough understanding of the embodiments of the invention. It will be apparent however, to one skilled in the art, that one or more other embodiments may be practiced without some of these specific details. The particular embodiments described are not provided to limit the invention but to illustrate it. The scope of the invention is not to be determined by the specific examples provided above but only by the claims below. In other instances, well-known structures, devices, and operations have been shown in block diagram form or without detail in order to avoid obscuring the understanding of the description. Where considered appropriate, reference numerals or terminal portions of reference numerals have been repeated among the figures to indicate corresponding or analogous elements, which may optionally have similar characteristics.

It should also be appreciated that reference throughout this specification to "one embodiment", "an embodiment", or "one or more embodiments", for example, means that a particular feature may be included in the practice of the invention. Similarly, it should be appreciated that in the description various features are sometimes grouped together in a single embodiment, Figure, or description thereof for the purpose of streamlining the disclosure and aiding in the understanding of various inventive aspects. This method of disclosure, however, is not to be interpreted as reflecting an intention that the invention requires more features than are expressly recited in each claim Rather, as the following claims reflect, inventive aspects may lie in less than all features of a single disclosed embodiment. Thus, the claims following the Detailed Description are hereby expressly incorporated into this Detailed Description, with each claim standing on its own as a separate embodiment of the invention.

What is claimed is:

1. A fabrication method comprising:
    forming a first directed self assembly alignment promotion material over first regions of a surface of a substrate but not over second regions of the surface of the substrate;
    forming a second directed self assembly alignment promotion material over the second regions of the surface of the substrate but not over the first regions of the surface of the substrate, the second directed self assembly alignment promotion material having an uppermost surface non-coplanar with an uppermost surface of the first directed self assembly alignment promotion material; and
    assembling a layer that includes at least two different polymeric materials over the first and second directed self assembly alignment promotion materials.

2. The method of claim 1, wherein forming the first directed self assembly alignment promotion material over the first regions of the surface of the substrate comprises introducing and reacting a first polymer brush material over the surface of the substrate, wherein the first polymer brush material comprises a polymer with one or more reactive groups proximate one end thereof, and wherein forming the second different directed self assembly alignment promotion material over the second regions of the surface of the substrate comprises introducing and reacting a second different polymer brush material over the surface of the substrate.

3. The method of claim 1, wherein the first regions of the surface of the substrate comprise a metal material, and wherein the second regions of the surface of the substrate comprise a dielectric material.

4. The method of claim 3, wherein the uppermost surface of the first directed self assembly alignment promotion material is above the uppermost surface of the second directed self assembly alignment promotion material.

5. The method of claim 3, wherein the uppermost surface of the first directed self assembly alignment promotion material is below the uppermost surface of the second directed self assembly alignment promotion material.

6. The method of claim 1, wherein assembling the layer that includes at least two different polymeric materials over the first and second directed self assembly alignment promotion materials comprises forming the layer having a substantially planar upper surface.

7. The method of claim 2, wherein the reacting the first polymer brush material over the surface of the substrate comprises at least one of:
 reacting at least one of an aminosilane, a halosilane, or an alkoxysilane with hydroxylated groups of the first regions of the surface of the substrate;
 reacting a functional group of a polymer with the hydroxylated groups of the first regions of the surface of the substrate;
 reacting a phosphonic acid with a metal of the first regions of the surface of the substrate;
 reacting a thiol with the metal of the first regions of the surface of the substrate;
 reacting at least one of triazole or a corrosion inhibitor with the metal of the first regions of the surface of the substrate;
 reacting 1, 2, 4 triazole with the metal of the first regions of the surface of the substrate;
 reacting a heterocycle corrosion inhibitors with the metal of the first regions of the surface of the substrate; or
 reacting a multi-functional electrophile with hydroxylated groups of the first regions of the surface of the substrate.

8. The method of claim 1, wherein each of the first regions of the surface of the substrate is over an interconnect line that has a width of no more than 20 nanometers.

9. The method of claim 1, wherein assembling the layer that includes at least two different polymeric materials over the first and second directed self assembly alignment promotion materials comprises assembling a layer comprising polystyrene and poly(methyl methacrylate).

10. An integrated circuit substrate comprising:
 a substrate having a surface with first regions and second regions;
 a first directed self assembly alignment promotion material over first regions of a surface of a substrate but not over second regions of the surface of the substrate;
 a second directed self assembly alignment promotion material over the second regions of the surface of the substrate but not over the first regions of the surface of the substrate, the second directed self assembly alignment promotion material having an uppermost surface non-coplanar with an uppermost surface of the first directed self assembly alignment promotion material; and
 an assembled layer that includes at least two different polymeric materials over the first and second directed self assembly alignment promotion materials.

11. The integrated circuit substrate of claim 10, wherein the first regions of the surface of the substrate comprise a metal material, and wherein the second regions of the surface of the substrate comprise a dielectric material.

12. The integrated circuit substrate of claim 11, wherein the uppermost surface of the first directed self assembly alignment promotion material is above the uppermost surface of the second directed self assembly alignment promotion material.

13. The integrated circuit substrate of claim 11, wherein the uppermost surface of the first directed self assembly alignment promotion material is below the uppermost surface of the second directed self assembly alignment promotion material.

* * * * *